(12) United States Patent
Shinohara et al.

(10) Patent No.: US 9,708,531 B2
(45) Date of Patent: Jul. 18, 2017

(54) FLUORESCENT SUBSTANCE, METHOD OF MANUFACTURING THE FLUORESCENT SUBSTANCE, AND LIGHT EMITTING DEVICE USING THE FLUORESCENT SUBSTANCE

(75) Inventors: Takayuki Shinohara, Anan (JP); Shoji Hosokawa, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 926 days.

(21) Appl. No.: 13/203,444

(22) PCT Filed: Feb. 26, 2010

(86) PCT No.: PCT/JP2010/001349
§ 371 (c)(1),
(2), (4) Date: Aug. 25, 2011

(87) PCT Pub. No.: WO2010/098141
PCT Pub. Date: Sep. 2, 2010

(65) Prior Publication Data
US 2011/0309399 A1 Dec. 22, 2011

(30) Foreign Application Priority Data
Feb. 26, 2009 (JP) .................. 2009-043584

(51) Int. Cl.
*C09K 11/77* (2006.01)
*C09K 11/08* (2006.01)
*H01L 33/50* (2010.01)

(52) U.S. Cl.
CPC ...... *C09K 11/0883* (2013.01); *C09K 11/7734* (2013.01); *C09K 11/7792* (2013.01);
(Continued)

(58) Field of Classification Search
CPC ............ C09K 11/0883; C09K 11/7706; C09K 11/7728; C09K 11/7734; C09K 11/7792; H01L 33/502
(Continued)

(56) References Cited

U.S. PATENT DOCUMENTS 6,649,946 B2 11/2003 Bogner et al.
7,252,788 B2 8/2007 Nagatomi et al.
(Continued)

FOREIGN PATENT DOCUMENTS

JP 2002-363554 12/2002
JP 2005-048105 2/2005
(Continued)

OTHER PUBLICATIONS

Li et al., "Phase Purity and Luminescence Properties of Fine Ca-α-SIALON:Eu Phosphors Synthesized by Gas Reduction Nitridation Method", Apr. 23, 2008, Journal of the Electrochemical Society, 155, (6), pp. J175-J179.*
(Continued)

*Primary Examiner* — Matthew E Hoban
*Assistant Examiner* — Lynne Edmondson
(74) *Attorney, Agent, or Firm* — Foley & Lardner LLP

(57) ABSTRACT

A fluorescent substance is provided having excellent temperature properties and capable of being excited by light in the region from near ultraviolet to short-wavelength visible light to emit light of yellow to red color. A process for producing the fluorescent substance, and a light emitting device using the fluorescent substance is also provided. The fluorescent substance includes M which is at least one group II element selected from Ca, Sr, and Ba, and Al, Si, O, and N, and activated with Eu. The fluorescent substance has an X-ray diffraction pattern using CuKα radiation, in which the intensity of the diffraction peak in the Bragg angle range of
(Continued)

17.9° to 18.5° is taken as 100%, the relative intensity of the diffraction peak is 150% to 310% in a Bragg angle range of 24.5° to 25.1°, and is 320% to 550% in a Bragg angle range of 34.8° to 35.4°.

21 Claims, 10 Drawing Sheets

(52) U.S. Cl.
CPC .. *H01L 33/502* (2013.01); *H01L 2224/16245* (2013.01); *H01L 2924/181* (2013.01)

(58) Field of Classification Search
USPC .... 252/301.4 R, 301.4 F; 313/503, 504, 467, 313/468; 257/98
See application file for complete search history.

(56) References Cited

U.S. PATENT DOCUMENTS

| | | | |
|---|---|---|---|
| 7,443,094 B2 | 10/2008 | Sakane et al. | |
| 7,544,310 B2 | 6/2009 | Hirosaki | |
| 2003/0030038 A1 | 2/2003 | Mitomo et al. | |
| 2006/0033083 A1 | 2/2006 | Sakane et al. | |
| 2006/0043337 A1 | 3/2006 | Sakane et al. | |
| 2007/0108455 A1 | 5/2007 | Sun et al. | |
| 2007/0166218 A1* | 7/2007 | Hirosaki | C01B 21/0826 423/325 |
| 2008/0001126 A1 | 1/2008 | Hirosaki | |
| 2008/0258602 A1* | 10/2008 | Masuda et al. | 313/487 |
| 2009/0050845 A1 | 2/2009 | Hirosaki et al. | |
| 2009/0134775 A1 | 5/2009 | Watanabe et al. | |
| 2009/0236963 A1* | 9/2009 | Nagatomi et al. | 313/483 |
| 2010/0102707 A1* | 4/2010 | Fukuda | C09K 11/0883 313/503 |

FOREIGN PATENT DOCUMENTS

| | | |
|---|---|---|
| JP | 2005-255895 | 9/2005 |
| JP | 2005-302920 | 10/2005 |
| JP | 2006-057018 | 3/2006 |
| JP | 2006-063323 | 3/2006 |
| JP | 2006-070109 | 3/2006 |
| JP | 2006-089547 | 4/2006 |
| JP | 2007-142389 | 6/2007 |
| JP | 2007-291352 | 11/2007 |
| JP | 2010-106127 A | 5/2010 |
| JP | 2010-185009 A | 8/2010 |
| WO | WO-01/40403 A1 | 6/2001 |
| WO | WO-2006/093298 A1 | 9/2006 |
| WO | WO-2006/106883 A1 | 10/2006 |
| WO | WO-2006/121083 A1 | 11/2006 |

OTHER PUBLICATIONS

International Search Report in PCT/JP2010/001349 dated Mar. 30, 2010.

* cited by examiner

FLUORESCENT SUBSTANCE, METHOD OF MANUFACTURING THE FLUORESCENT SUBSTANCE, AND LIGHT EMITTING DEVICE USING THE FLUORESCENT SUBSTANCE

BACKGROUND OF THE INVENTION

1. Field of the Invention

The present invention relates to a fluorescent substance and a method of manufacturing the fluorescent substance and a light emitting device using the fluorescent substance, and particularly to a fluorescent substance which contains oxygen and nitrogen and which is chemically stable, and to a method of manufacturing the fluorescent substance and to a light emitting device using the fluorescent substance.

2. Description of Related Art

A light emitting device capable of emitting light of various wavelengths by combining the light emitted from a light source and a fluorescent substance which is excited by the light from the light source and is capable of emitting light of different hue than the light from the light source, according to principle of mixing light has been developed. Examples of such a light emitting device include a white LED device which uses a blue semiconductor light emitting element and green to yellow light emitting yttrium-aluminum-garnet based fluorescent substance ($Y_3Al_5O_{12}$:Ce). The white LED provides white light by color mixing of green to yellow light obtained by wavelength converting a part of blue light emitted from the light emitting element and blue light whose wavelength has not been converted. However, this system is unable to provide a sufficient amount of emission of visible light in long wavelength region, so that a white light of reddish hue such as an incandescent color cannot be obtained and it has low color rendering properties.

In contrast, a light emitting device employing a blue light emitting element and fluorescent substances which are excited by the blue light of the light emitting element and respectively emit light of green and red is capable of producing white light with good color rendering properties by additive color mixing of the three primary colors of light: blue, green, and red. Examples of the methods using additive color mixing of the three primary colors of light include a method in which a light emitting element capable of emitting near ultraviolet light is used to excite fluorescent substances of blue, green, and red colors by the near ultraviolet light emitted from the light emitting element and obtain a white light by the emissions from the respective fluorescent substances. As for a fluorescent substance applicable for such a light emitting device, a fluorescent substance capable of converting wavelength of light in the near ultraviolet region to a shorter wavelength range in the visible light region and emitting light of a longer wavelength range in visible light such as red light has been extensively developed.

For example, an oxynitride activated with a rare-earth element with which a higher brightness can be obtained in white LED having a blue LED light source is provided (for example, see JP 2002-363554A (Patent Reference 1)). The oxynitride fluorescent substance is represented by the formula $Me_xSi_{12-(m+n)}Al_{(m+n)}O_nN_{16-n}$:$Re1_y Re2_z$, in which a part or all of metal Me (where Me is at least one selected from Ca, Mg, Y, and lanthanide metals excluding La and Ce) in alpha-sialon solid solution is substituted by lanthanide metal Re1 (where Re1 is at least one selected from Ce, Pr, Eu, Tb, Yb and Er), or two lanthanide metals Re1 and a co-activator Re2 (where Re2 is Dy), to be an emission center. When the metal Me is bivalent, $0.6<m<3.0$ and $0 \le n<1.5$. When the metal Me is trivalent, $0.9<m<4.5$ and $0 \le n<1.5$. A fluorescent substance according to the present invention has different ratios of Al, Si, and N with respect to Me, so that it has a different composition than that of the oxynitride fluorescent substances described above.

Also, a fluorescent substance composition which is excitable by a near ultraviolet to blue light and emits a warm color light, especially a red color light is provided (for example, see JP 2005-48105A (Patent Reference 2). The fluorescent substance composition contains as a main component a composition represented by the composition formula: $a((1-x-y)MO.xEuO.yCe_2O_3.bSi_3N_4.cAlN$, and is made of a crystalline material, where M in the composition formula is at least one alkaline earth metal element selected from Mg, Ca, Sr, and Ba, and a, b, c, x, and y in the composition formula respectively satisfies $0.3 \le a/(a+b) \le 0.9$, $0.2 \le a/(a+c) \le 0.8$, $0.3 \le c/(b+c) \le 0.9$, $0.2 \le x \le 0.2$, $0 \le y \le 0.2$, and $0.002 \le x+y \le 0.2$.

However, the composition ranges of a, b, and c in the composition formula of the above fluorescent substance are not specified, so that appropriate disclosure of the invention has not been provided and thus the invention has not been sufficiently identified. Meanwhile, according to the examples of this patent reference, the ratio of N to M in the fluorescent compositions in Examples 1 to 18 and Examples 20 to 25 are different than that of the present invention, thus indicating different compositions. The fluorescent substance composition in Example 19 has a different ratio of Al to M than that of the present invention, thus having a different composition.

A fluorescent substance having an emission property with an emission peak wavelength in a range of 580 to 680 nm and high emission intensity, and having an excitation band property of a flat excitation band with high efficiency for excitation light in a broad wavelength range from ultraviolet to visible light has been provided (wavelength range from 250 nm to 550 nm) (for example, see JP2006-63323A (Patent Reference 3)). The fluorescent substance includes a product phase whose main phase showing a diffraction peak with relative intensity of 10% or more in the Bragg angle ($2\theta$) range of 36.5° to 37.5° and 41.9° to 42.9° in X-ray diffraction pattern, when the relative intensity of the diffraction peak having a highest intensity in the X-ray powder diffraction pattern obtained with CoKα ray is defined as 100%. The product phase of the fluorescent substance is represented by the composition formula $M_m A_a B_b O_o N_n$:Z, where element M is an element such as Ca, Sr, and Mg, element A is an element such as Al, element B is an element such as Si, O is oxygen, N is nitrogen, and element Z is an element such as Eu, satisfying $n=2/3m+a+4/3b-2/3b-2/3o$, $m/(a+b) \ge 1/2$, $(o+n)/(a+b) > 4/3$, $o \ge 0$, and $m:a:b=1:1:1$. The ratios of M to A, B, and N are different in the above-described fluorescent substance and a fluorescent substance according to the present invention, which indicates different compositions.

A fluorescent substance that has a broad peak of an emission spectrum in a green to yellow range, has such a wide and flat excitation band that can realize the use of a wide range of light from near ultraviolet/ultraviolet light to blue light as excitation light has been provided (see for example WO 2006/093298 A (Patent Reference 4)). The fluorescent substance is represented by general formula $MmA_a B_b O_o N_n$:Z in which M is an element such as Ca, Sr, and Mg, A is an element such as Al, B is an element such as Si, O is oxygen, N is nitrogen, and Z is an element such as Eu, and $4.0<(a+b)/m<7.0$, $a/m \ge 0.5$, $b/a > 2.5$, $n>o$, $n=2/3m+a+4/3b-2/3o$. Upon excitation with light in a wavelength range of 300 nm to 500 nm, the fluorescent substance exhibits an emission spectrum having a peak wavelength range of 500 nm to 650 nm. However, the composition ranges of a, b, m, o, and n in the composition formula of the above fluorescent substance are not specified, so that appropriate disclosure of the invention has not been provided and thus the invention has not been sufficiently identified. Meanwhile, according to the above example, this fluorescent substance has ratios of A to M, or B to M and N to M which are different than that of the fluorescent substance according to the present invention, thus having a different composition.

A fluorescent substance having a broad emission spectrum in the blue region (peak wavelength of 400 nm to 500 nm) and a broad flat excitation band in the near ultraviolet/ultraviolet region has been provided (see for example, WO 2006/106883A (Patent Reference 5)). The fluorescent substance is represented by general formula $MmA_aB_bO_oN_n$:Z in which M is an element such as Ca, Sr, and Mg, A is an element such as Al, B is an element such as Si, O is oxygen, N is nitrogen, and Z is an element such as Eu, satisfying $5.0<(a+b)/m<9.0$, $0 \leq a/m \leq 2.0$, $0 \leq o<n=2/3m+a+4/3b-2/3o$, and has an emission spectrum with a peak in the wavelength range from 400 nm to 500 nm under an excitation of the light in a wavelength range from 250 nm to 430 nm. However, the composition range of N with respect to N in the composition formula of the above fluorescent substance is not specified, so that appropriate disclosure of the invention has not been provided. Meanwhile, according to the above example, this fluorescent substance has a different ratio of N to M than that of a fluorescent substance according to the present invention, thus has a different composition. Also, this fluorescent substance emits light of blue color which is different emission color than a fluorescent substances of the present invention.

A fluorescent substance having higher brightness, an orange or red emission characteristic has been provided (see for example JP 2006-89547A (Patent Reference 6)). The fluorescent substance includes, as an active substance, a crystal represented by $A_2Si_{5-x}Al_xO_xN_{8-x}$ (in which A is one selected from Mg, Ca, Sr, and Ba, and x has a value of 0.05 to 0.8) to which a metal element M (M is an element such as Eu) is incorporated to form a solid solution. This fluorescent substance has ratios of Si, Al, O, and N with respect to A which are different than that of a fluorescent substance according to the present invention, thus having a different composition.

A green fluorescent substance which has higher brightness in green color than that of a conventional sialon fluorescent substance activated with a rare earth element and has superior durability than that of a conventional oxide fluorescent substance is provided (see for example JP 2005-255895A (Patent Reference 7)). The fluorescent substance is represented by $Si_{6-z}Al_zO_zN_{8-z}$ ($0<z<4.2$) which includes a crystal of nitride or oxynitride having a β-type $Si_3N_4$ crystal structure having a metal element M (M is an element selected from Mn, Ce, and Eu) solid-dissolved into it, and emits a fluorescent light having a peak in a range of 500 nm to 600 nm in wavelength upon being irradiated with an excitation source. However, this fluorescent substance does not include elements such as Ca and Sr. Also, the above fluorescent substance and a fluorescent substance according to the present invention have different compositions. Also, this fluorescent substance emits light of green color which is a different emission color than that of a fluorescent substance according to the present invention.

A β-type sialon fluorescent substance which uses a light source of blue to ultraviolet light and is capable of realizing a white light emitting diode has been provided (see for example WO 2006/121083A (Patent Reference 8)). The above fluorescent substance is a β-type sialon fluorescent substance which includes a β-type sialon represented by general formula $Si_{6-z}Al_zO_zN_{8-z}$ ($0.24 \leq z \leq 4.2$) as a matrix material and Eu in a solid solution form as a luminescent center. However, this fluorescent substance does not include elements such as Ca and Sr. Also, the above fluorescent substance and the fluorescent substances according to the present invention have different compositions. Further, this fluorescent substance emits light of green color which is a different emission color than that of the fluorescent substances according to the present invention.

A light source using a fluorescent substance capable of converting at least a part of the radiation of a primary light source to emit light of yellow to red color, in which the fluorescent substance has a host lattice of a nitridosilicate type $M_xSi_yN_z$:Eu (in which M is at least one alkaline earth metal selected from the group consisting of Ca, Sr, Ba and Zn, and z=2/3x+4/3y, x=2 and y=5, or x=1 and y=7), has been disclosed (see for example WO 2001/40403A (Patent Reference 9)). However, this fluorescent substance does not include Al. Also, this fluorescent substance and a fluorescent substance according to the present invention have different compositions.

Further, CaS:Eu and $Ln_2O_2S$:Eu, for example, are known as a fluorescent substance capable of emitting long-wavelength visible light such as red light; however, they have poor chemical stability and show significant decline in brightness under a condition of high temperature. Such a fluorescent substance does not exhibit sufficient brightness as well. In recent years, a fluorescent substance, which has a favorable excitation band in a region of near ultraviolet to short wavelength visible light and is capable of converting a wavelength to obtain light of yellow to red color, and contains nitrogen which is chemically stable, has been developed. Examples of such a fluorescent substance containing nitrogen include $Ca_2Si_5N_8$:Eu, and a light emitting device employing such a fluorescent substance to improve color rendering properties has been described (see for example JA 2007-142389A (Patent Reference 10)).

However, the above-described fluorescent substance containing nitrogen has a problem of significant reduction in brightness under a condition of high temperature. Also a fluorescent substance having poor thermal properties may cause color unevenness when it is employed in a light emitting device, because under a high temperature, the ratio of the fluorescent substance and other emission of different colors may differ largely in the mixed color of the emission.

SUMMARY OF THE INVENTION

The present invention is devised to solve the problems described above. That is, a main object of the present invention is to provide a fluorescent substance having excellent temperature properties and capable of being excited by light in the region from near ultraviolet to short-wavelength visible light to emit light of a yellow to red color, a method of manufacturing the fluorescent substance, and a light emitting device using the fluorescent substance.

The present invention concerns a fluorescent substance represented by general formula shown below. $M_aAl_bSi_cO_d$-$N_e$:Eu (M is at least one group II element selected from Ca, Sr, and Ba, a=2, b=2.4 to 6.0, c=5.0 to 8.5, d=1.0 to 3.0, and e=11.0 to 16.0). The fluorescent substance has a property of having an emission peak wavelength at 570 nm to 670 nm upon being excited by a light source of 460 nm. The above described means that Eu is substituted by a part of M, and the total mole numbers of M and Eu is 2 mol, which is applied in the same manner below unless specifically stated otherwise.

The present invention concerns a fluorescent substance containing M which is at least one group II element selected from Ca, Sr, and Ba, and Al, Si, O, and N, and activated with Eu. The fluorescent substance includes a product phase whose main phase showing a diffraction peak with relative intensity of 150% to 310% in the Bragg angle range of 24.5° to 25.1° and 320% to 550% in the Bragg angle range of 3.48° to 35.4° in a X-ray diffraction pattern, when the intensity of the diffraction peak in a Bragg angle range of 17.9° to 18.5° in the X-ray diffraction pattern obtained with CuKα ray is defined as 100%.

The fluorescent substance preferably has a peak wavelength in a range of 570 nm to 670 nm in an emission spectrum obtained by absorbing light in a range from near ultraviolet to short wavelength range of visible light. The fluorescent substance preferably contains Si in a range of 19.0 wt % to 29.5 wt %. The fluorescent substance preferably belongs to orthorhombic system with lattice constant in a range of 4.4 Å≤a≤5.4 Å, 7.0 Å≤b≤8.0 Å, and 11.1 Å≤c≤12.1 Å.

The present invention also concerns a light emitting device having an excitation light source capable of emitting light of a peak wavelength in a range from near-ultraviolet to short wavelength range of visible light and a fluorescent substance described above which is capable of absorbing a part of light from the excitation light source and emitting fluorescent light.

EFFECT OF THE INVENTION

The present invention concerns a fluorescent substance, a method of manufacturing the fluorescent substance and a light emitting device using the fluorescent substance, a fluorescent substance capable of being excited by light in a range from near-ultraviolet to blue light which is in a short wavelength range of visible light and emitting yellow to red light and which has less reduction of brightness even under a condition of high temperature. In a light emitting device which uses the above-described fluorescent substance, even under a high temperature, the above described fluorescent substance exhibits less reduction in brightness, so that occurrence of deviation in the ratio in color mixing with an emission having different hue can be suppressed.

DETAILED DESCRIPTION OF PREFERRED EMBODIMENTS

Hereinafter, examples of the present invention will be described in detail. The examples described below are to exemplify a fluorescent substance and a method of manufacturing the fluorescent substance and a light emitting device using the fluorescent substance so as to materialize the technical idea of the present invention. The present invention does not limit the fluorescent substance, the method of manufacturing the fluorescent substance and the light emitting device using the fluorescent substance to those described below. The relation between the color name and the chromaticity coordinates, the relation between the wavelength of light and the color name of single light, and the like are indicated in accordance with JIS Z8110. Specifically, 380 nm to 455 nm is a blue purple color, 455 nm to 485 nm is a blue color, 485 nm to 495 nm is a blue green color, 495 nm to 548 nm is a green color, 548 nm to 573 nm is a yellow green color, 573 nm to 584 nm is a yellow color, 584 nm to 610 nm is a yellow red color, and 610 nm to 780 nm is a red color.

A fluorescent substance according to the present embodiment is represented by the general formula shown below. $M_aAl_bSi_cO_dN_e$:Eu (M is at least one group II element selected from Ca, Sr, and Ba, a=2, b=2.4 to 6.0, c=5.0 to 8.5, d=1.0 to 3.0, and e=11.0 to 16.0). The fluorescent substance has an emission peak at a wavelength of 570 nm to 670 nm upon being excited by a light source of 460 nm. The fluorescent substance according to the present embodiment is a fluorescent substance containing M which is at least one group II element selected from Ca, Sr, and Ba, and Al, Si, O, and N, and activated with Eu. Al stands for Aluminum, Si stands for silicon, O stands for oxygen, N stands for nitrogen, and Eu stands for europium. The fluorescent substance contains a product phase having a crystal structure determined by the X-ray diffraction pattern which is to be described later. A fluorescent substance according to the present embodiment absorbs light of a range from the near-ultraviolet to short wavelength region of visible light and emits light in the region of yellow to red color. In the present specification, the term "region from the near-ultraviolet to short wavelength region of visible light" is not specifically limited but preferably in a range of 250 nm to 520 nm.

Figure 1:
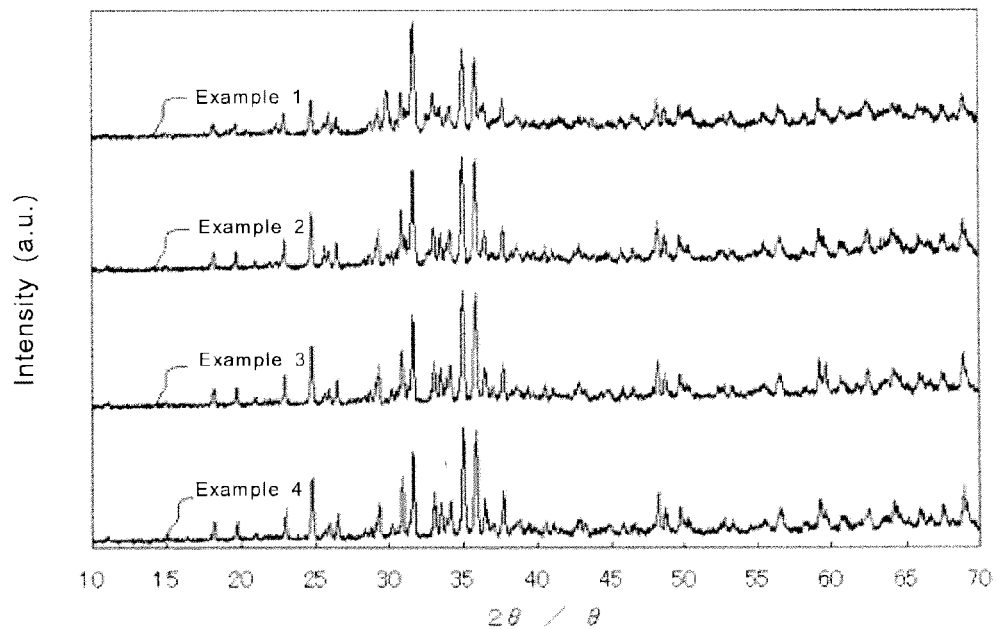
FIG. 1 shows measurement results of X-ray diffraction patterns of the fluorescent substances according to Examples 1 to 4.

The X-ray diffraction patterns of the fluorescent substances according to the present embodiment will be described below with reference to FIG. 1. FIG. 1 is a diagram showing the X-ray diffraction patterns with CuKα radiation of the fluorescent substances of Examples 1 to 4, which are to be described later for exemplifying the fluorescent substances according to the present embodiment.

As shown in each of the x-ray diffraction patterns of the respective Examples 1 to 4, the fluorescent substances according to the present embodiment have the diffraction peaks in the Bragg angle ranges of 17.9° to 18.5°, 24.5° to 25.1°, 30.6° to 31.2°, 34.8° to 35.4°, 35.7° to 36.3°, and 68.7° to 69.3°.

It is preferable that, with the intensity of the diffraction peak in the Bragg angle range of 17.9° to 18.5° is taken as 100%, the relative intensity of the diffraction peak in the Bragg angle range of 24.5° to 25.1° is 150% to 310%. In the same manner, the relative intensity of the diffraction peak in the Bragg angle range of 30.6° to 31.2° is preferably 190% to 460%. In the same manner, the relative intensity of the diffraction peak in the Bragg angle range of 34.8° to 35.4° is preferably 320% to 550%. In the same manner, the relative intensity of the diffraction peak in the Bragg angle range of 35.7° to 36.3° is preferably 270% to 570%. In the same manner, the relative intensity of the diffraction peak in the Bragg angle range of 68.7° to 69.3° is preferably 160% to 320%.

As shown in the X-ray diffraction patterns of each of the Examples 1 to 4, a fluorescent substance according to the present embodiment preferably has a relative intensity of the diffraction peak of 90% to 240% in the Bragg angle range of 29.0° to 29.6°, when the intensity of the diffraction peak in the Bragg angle range of 17.9° to 18.5° taken as 100%. In the same manner, the relative intensity of the diffraction peak is preferably 310% to 910% in the Bragg angle range of 31.4° to 32.0°. In the same manner, the relative intensity of the diffraction peak is preferably 140% to 290% in the Bragg angle range of 47.9° to 48.5°.

Now, the measuring method of the x-ray diffraction pattern of the fluorescent substance of the present embodiment will be described below. The XRD apparatus and the measuring condition are shown below.

XRD apparatus: MiniFlex manufactured by Rigaku Corporation
X-ray tube: CuKα
Tube voltage: 30 kV
Tube voltage: 15 mA
Scanning mode: 2θ/θ
Scanning speed: 4°/min
Scanning Step: 0.02°

A deviation in the Bragg angle of the refractive peak may occur due to a change in the Al/Si ratio and/or a formation of solid solution with other elements, and also in the case where the surface of the sample to be irradiated with the X-ray is not flat, or in the case where a different measuring condition is employed. Therefore, a slight deviation in the Bragg angle range of the diffraction peak is considered to be allowed.

The fluorescent substance according to the present embodiment exhibits a broad excitation spectra indicating efficient excitation over a wide range of wavelength of 250 nm to 520 nm. The fluorescent substance according to the present embodiment is capable of emitting light with an intensity of 50% or greater upon excitation by light with the excitation wavelength of 300 nm to 470 nm, with the maximum emission intensity as 100% when excited by light with a wavelength in the range described above. It is more preferable to emit light with an intensity of 75% or greater upon excitation by light with the excitation wavelength of 300 nm to 470 nm.

The fluorescent substance according to the present embodiment has a peak wavelength in the wavelength range of 573 nm to 650 nm and capable of emitting light of yellow to red color. Particularly, arranging the peak wavelength in the wavelength range of 584 nm to 630 nm, light of yellow-red to red color with high brightness can be obtained. Half bandwidth of emission spectra of the fluorescent substance according to the present embodiment may be arranged in a range of 100 nm to 125 nm, preferably in a range of 107 nm to 117 nm. Having an emission spectrum with such a wide half bandwidth enables one to recreate light in a wide wavelength range.

According to Examples 1 to 17, the molar ratio of the constituent elements of the fluorescent substance according to the present embodiment is preferably (group II element M+Eu):Al:Si:N=1:1.1 to 4.3:2.6 to 4.9:47 to 8.9. It is more preferably (group II element M+Eu):Al:Si:O:N=1:2 to 3:3.1 to 4.1:0.2 to 1.3:6.1 to 8.1. It is further preferably (group II element M+Eu):O=1:0.2 to 0.8. It is preferably (group II element M+Eu):N=1:6.7 to 8.0 and more preferably 7.2 to 8.0. With the inclusion of each element with such a molar ratio, the fluorescent substances according to the present embodiment can emit light of yellow to red color with high brightness.

According to Examples 21 to 63, the molar ratio of the constituent elements of the fluorescent substances according to the present embodiment is (group II element M+Eu):Al: Si:O:N=2:2.4 to 6.0:5.0 to 8.5:1.0 to 3.0:11.0 to 16.0. According to Examples 27 to 34, the concentration of Eu is preferably (group II element M+Eu):2:0.03 to 0.29. According to Examples 35 to 38, it is preferably (group II element M+Eu):Al+Si=2:10.56 to 11.90. According to Examples 39 to 43, it is preferably Al:Si=1:1.7 to 2.5. According to Examples 44 to 48, it is preferably (group II element M+Eu):Al=2:3.43 to 3.91. According to Examples 49 to 54, it is preferably (group II element M+Eu):Si=2:6.66 to 7.96. According to Examples 55 to 63, it is preferably (group II element M+Eu):O:N=2:1.10 to 2.00:11.38 to 13.11. With the inclusion of each element with such a molar ratio, the fluorescent substances according to the present embodiment can emit light of yellow to red color with high brightness.

In the fluorescent substances according to the present embodiment, the group II element M which is at least one element selected from Ca, Sr, and Ba is preferably Sr. Here, a part or all of Sr may be substituted with Ca and/or Ba. In the case where a part of Sr is substituted with Ca, the concentration of Ca with respect to Sr is preferably 10% or less, and more preferably 5% or less. In the case where a part of Sr is substituted with Ba, the concentration of Ba with respect to Sr is preferably 8% or less, and more preferably 4% or less. As described above, the peak wavelength of the fluorescent substance can be appropriately adjusted by adjusting the compounding ratio of Ca, Sr, and Ba of the group II element M.

The fluorescent substances according to the present embodiment employ Eu, which is a rare earth element, as an activator. The concentration of the activator with respect to the element M is preferably 0.001% to 20%, and more preferably 8% to 12%. The activator is not limited only to Eu, and a part of Eu may be substituted with one or more rare earth metal elements such as Sc, Y, La, Ce, Pr, Nd, Sm, Gd, Tb, Dy, Ho, Er, Tm, Yb, and Lu, and alkaline earth metal elements. With this arrangement, the substituted element and Eu co-activate so that adjustment in the light emitting property such as changing the tone of emission color of the fluorescent substance can be performed.

According to Examples 1 to 17, it is preferable that a fluorescent substance of the present embodiment contains 22.0 wt % to 29.0 wt % of (M+Eu) and 13.0 wt % to 22.0 wt % of Al. It is preferable to also contain 19.0 wt % to 29.5 wt % of Si. Further, it is further preferable to contain 0.1 wt % to 9.0 wt % of O and 22.0 wt % to 30.0 wt % of N. With the inclusion of each element with such a wt %, the fluorescent substance according to the present embodiment can emit light of yellow to red color with high brightness.

According to Examples 21 to 63, it is preferable that a fluorescent substance of the present embodiment contains 23.0 wt % to 31.0 wt % of (M+Eu), 10.0 wt % to 16.0 wt % of Al, 23.0 wt % to 31.0 wt % of Si, 2.5 wt % to 8.0 wt % of O, and 22.0 wt % to 28.0 wt % of N. With the inclusion of each element with such a wt %, the fluorescent substances according to the present embodiment can emit light of yellow to red color with high brightness.

The color tone and brightness of a fluorescent substance according to the present embodiment can be adjusted by changing the composition ratio of O and N. Further, a fine adjustment of the emission spectrum and intensity can be obtained by changing the composition ratio of positive ions and negative ions in (M+Al+Si)/(O+N). Thus, adjusting the composition ratio allows one to control the shifting of the peak wavelength.

A fluorescent substance according to the present embodiment may contain at least one element selected from the group consisting of Li, Na, K, Rb, Cs, Mn, Re, Cu, Ag, and Au in the respective compositions. Further, other elements may be contained to the degree that they do not degrade the properties of the fluorescent substances.

The fluorescent substances according to the present embodiment are capable of maintaining the brightness of 88% or more at approximately 100° C. with the brightness at approximately 25° C. as 100%. In a condition at approximately 200° C., the brightness of 62% or more can be maintained.

The fluorescent substances according to the present embodiment have a unit cell which belongs to the orthorhombic crystal system, based on crystal analysis of the X-ray diffraction pattern which to be described later. It is preferable that the fluorescent substances are mainly made of a crystal. Specifically, at least 50 wt % or more, more preferably 80 wt % or more has crystal structure. This shows the percentage of a crystalline phase which has luminescent properties. It is preferable that emission sufficient for practical application can be obtained with the content of crystalline phase of 50 wt % or more. Employing such a power can facilitate the manufacturing and processing. For example, a glass body (amorphous) has a loose structure so that the composition ratio in the fluorescent substance may be non-constant, which may lead to uneven chromaticity. Therefore, a necessity arises to control the reaction conditions in the manufacturing process to avoid the above.

In view of incorporation of the fluorescent substance according to the present embodiment in a light emitting device, the fluorescent substance preferably has an average diameter in a range of 1 μm to 100 μm, more preferably in a range of 2 μm to 50 μm. The fluorescent substance having an average particle size of the range described above is preferably contained at a high ratio. Further, the fluorescent substance preferably has a narrow particle size distribution to suppress color deviation. The average particle size may be provided as F.S.S.S.No. (Fisher Sub Sieve Sizer's No.), obtained by using an air permeation method. Specifically, under an environment of a temperature of 25° C. and a humidity of 70%, 1 cm$^3$ of a sample is measured and packed in a special tubular vessel and then a dry air is passed through the vessel at a constant pressure. The specific surface area is obtained based on the difference in the pressure and converted to the mean particle diameter.

(Method of Manufacturing)

A method of manufacturing the fluorescent substance according to the present embodiment will be described below. For the fluorescent substance, a single body, an oxide, a carbonate or a nitride of an element which is included in the composition, is used as a raw material. Each raw material is weighed to provide a predetermined feed composition ratio. Here, the molar ratio of each of the elements in the raw materials containing the constituent elements of the fluorescent substance is shown in the "feed composition ratio".

According to Examples 1 to 17, the feed composition ratio of the fluorescent substances of the present embodiment is (M+Eu):Al:Si:N=1:1 to 3:3 to 4.875:5 to 8.13, preferably (M+Eu):Al:Si:N=1:1 to 2:3.375 to 4.5:5.63 to 7.5. According to Examples 21 to 63, the feed composition ratio of (M+Eu), Al, Si, and N is predetermined respectively as shown in the tables below. Each of the raw materials is weighed to satisfy the respective ratio. Also, an additional material such as a flux can be appropriately added to the raw materials. Further, boron can be contained as needed.

The raw materials as described above are mixed uniformly either in wet or dry conditions using a mixing machine. For the mixing machine, besides a ball mill which is commonly used in industrial processes, a vibration mill, a roll mill, a jet mill or other grinders may be used. In order to control the specific surface area of the resultant powder within a predetermined range, the materials may also be classified using a wet separator such as a sedimentation tank, a hydrocyclone, a centrifugal separator or the like which is commonly used in industrial processes, or a dry classifier such as a cyclone or an air separator. The mixture is then charged in a crucible or plate-shaped boat made of a material such as SiC, quartz, alumina, or boron nitride, and fired. For firing, a tubular furnace, a miniature furnace, a high-frequency furnace, a metal surface, or the like, can be used. The firing is preferably carried out in a reducing atmosphere with a flow of gas. Specifically, it is preferable to carry out the firing in a nitrogen atmosphere, a mixed atmosphere of nitrogen and hydrogen, an ammonia atmosphere, or a mixed atmosphere of these gases.

The firing temperature is preferably 1200° C. to 2000° C., and more preferably 1500° C. to 1800° C. The firing time is preferably 15 hours to 200 hours, more preferably 20 hours to 150 hours, and most preferably 40 hours to 150 hours. After the firing, the fired mixture is subjected to grinding, dispersion, filtration and/or other process to obtain the desired fluorescent substance powder. Separation of solid and liquid components may be carried out by a process commonly used in industrial processes such as filtration, suction filtration, pressure filtration, centrifugal separation or decantation. Drying may be carried out by using a machine or a method which are commonly used in industrial operations such as a vacuum dryer, or a hot air heating dryer. Next, specific examples of the raw materials for the fluorescent substances will be described below. For the raw materials Ca, Sr, Ba, which are referred to element M in the feed composition ratio, the respective elements can be used singly or in a form of metal or chemical compound such as an oxide, an imide, an amide, a nitride, or various kinds of salts such as a carbonate, a phosphate, and a silicate. Specifically, $SrCO_3$, $Sr_3N_2$, $CaCO_3$ or the like, can be used. Also, for Al, Si in the feed composition ratio, each element can be used singly or in a form of metal or chemical compound such as an oxide, an imide, an amide, a nitride, or various kinds of salts. The materials for the element M, Si, and Al may be preliminary mixed. Specifically, AlN, $Al_2O_3$, $Si_3N_4$, $SiO_4$, or the like can be used. Also, for example, in the chemical compounds containing Si, the purity of Si of a raw material is preferably 2N or more, but other elements such as Li, Na, K, B, and Cu may be contained. Further, in order to substitute a part of Si with at least one of Al, Ga, In, Ge, Sn, Ti, Zr, and Hf, a compound containing such elements may also be used.

Further, Eu which serves as an activator is preferably used as a single substance, but a haloid salt, an oxide, a carbonate, a phosphate, a silicate, or the like can be used. Specifically, $Eu_2O_3$ or the like can be used. In the case where a part of Eu is to be substituted with other elements, a chemical compound containing an element such as a rare earth element other than Eu can be mixed with the chemical compound containing Eu. An element additionally added as required is commonly added in the form of an oxide or a hydroxide, but it is not limited thereto and a metal, a nitride, an imide, an amide, or other inorganic salts of the element may be employed. Also, the element may be preliminarily contained in other raw materials. It is preferable that the average particle size of each raw material is about 0.1 μm to about 15 μm, more preferably about 0.1 μm to about 10 μm, from the viewpoint of reactivity with other raw materials, the control of the particle size at firing or after firing or the like. If the particle size of larger than this range is included, crushing may be carried out in a globe box in an argon atmosphere or a nitrogen atmosphere to obtain an appropriate particle size.

(Light Emitting Device)

Figure 8:
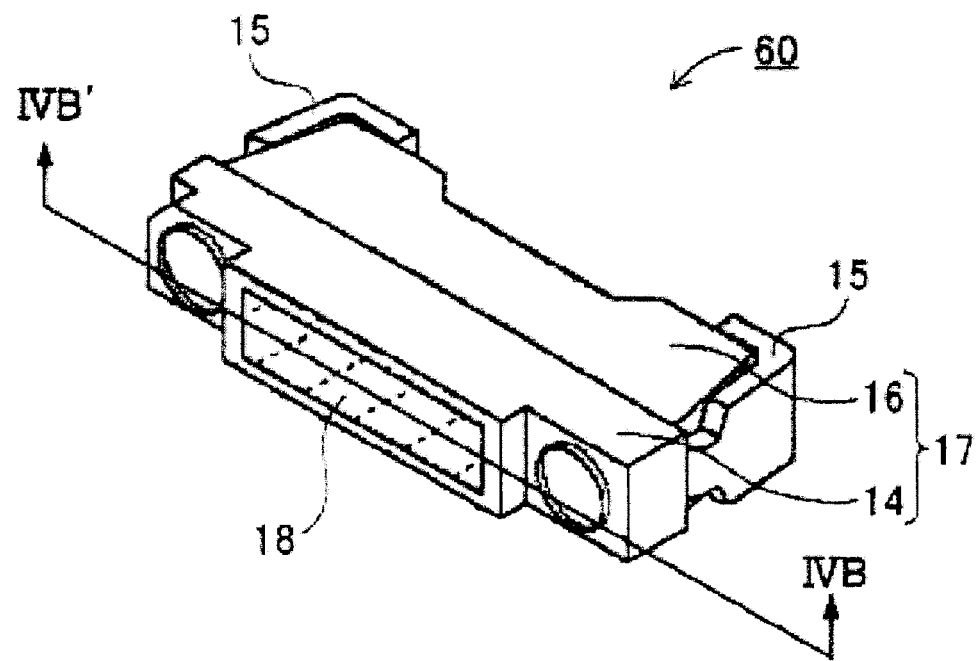
FIG. 8 is a perspective view showing a light emitting device according to the present embodiment.
Figure 9:
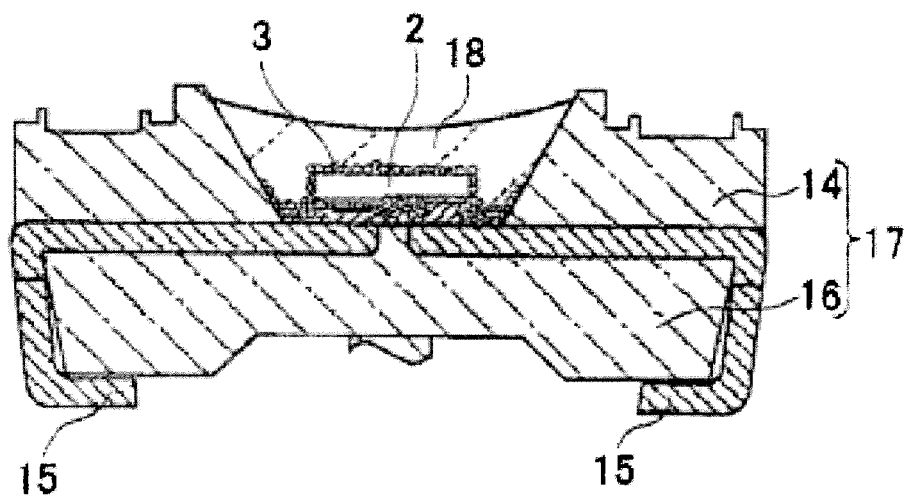
FIG. 9 is a cross-sectional view taken along line VIB-VIB' of FIG. 8.

Examples of light emitting devices using a fluorescent substance according to the present embodiment will be illustrated below. Examples of the light emitting device include a lighting apparatus such as a fluorescent lamp, a display device such as a display and radar, and a backlight for liquid crystal. For the excitation light source, a light emitting element capable of emitting light in the region from near ultraviolet to short-wavelength visible light is preferable. Particularly, a semiconductor light emitting element is small in size, has high power efficiency and emits light with clear color. Other excitation light sources, including a mercury lamp or the like, which is used in an existing fluorescent lamp can be appropriately used. There are various types such as a shell shape type and a surface mount type for the light emitting devices provided with a light emitting element. In this embodiment, a surface-mount type light emitting device is illustrated with reference to FIG. 8 and FIG. 9. FIG. 8 and FIG. 9 each shows a light emitting device 60 according to the present embodiment. FIG. 8 is a perspective view of the light emitting device 60, and FIG. 9 is a cross-sectional view of the light emitting device 60 taken along line IVB-IVB' of FIG. 8, respectively. The light emitting device 60 is a side-view type light emitting device which is a kind of surface-mount type.

The light emitting device 60 includes a recess portion 14 and a light emitting element 2 housed in the recess defined in the recess portion 14. Further, the recess in the recess portion 14 is filled with a resin containing a fluorescent substance 3. The recess portion 14 is a part of the package 17. That is, the package 17 is constituted with the recess portion 14 and the supporting body 16 is connected to the recess portion 14. Positive and negative electrodes 15 are interposed between the recess portion 14 and a support member 16 to provide a mounting surface for the light emitting element 2 in the recess portion 14. Further, the lead electrodes 15 are exposed on the outer surface side of the package 17 so as to conform to the outer shape thereof. The light emitting element 2 is mounted on and electrically connected to the lead electrodes 15 in the recess portion 14 and is capable of emitting light with a supply of electric power from the outside through the lead electrodes 15. The figure shows a typical arrangement of the light emitting device 60 being mounted with the bottom surface which is wider and perpendicular to the mounting surface of the light emitting element 2. With the above-described structure, a light emitting device 60 capable of emitting light in the direction approximately in parallel to the mounting surface of the light emitting element, that is, emitting light from the side surface adjacent to the mounting surface of the light emitting device can be obtained.

In the light emitting device 60 according to the present embodiment, a light transmissive resin is filled to cover the light emitting element 2 mounted in the recess portion 14 of the package 17 as described above. Thus, the sealing member 18 is formed. The fluorescent substance 3 is contained in the sealing member 18.

The members constituting the light emitting device according to the present embodiment will be described below.

(Light Emitting Element)

The light emitting element 2 can emit light from ultraviolet region to visible light region. The peak wavelength of the light emitted from the light emitting element 2 is preferably from 240 nm to 520 nm, more preferably from 420 nm to 470 nm. For the light emitting element 2, for example, a nitride semiconductor element ($In_XAl_YGa_{1-X-Y}N$, $0 \leq X$, $0 \leq Y$, $X+Y \leq 1$) can be used. Using a nitride semiconductor element allows obtaining stable light emitting devices with high resistance against mechanical shock.

(Fluorescent Substance)

The fluorescent substance 3 according to the present embodiment is disposed so as to be unevenly distributed to a part in the sealing member 18. As described above, disposing the fluorescent substance close to the light emitting element 2 enables efficient wavelength conversion of light from the light emitting element 2 and the light emitting device of excellent luminous efficiency can be obtained. Alternatively, disposing the fluorescent substance 3 in the sealing member 17 at an approximately uniform rate may enable one to obtain light without color unevenness.

For the fluorescent substance 3, two or more kinds of fluorescent substances may be used. For example, in the light emitting device 60 according to the present embodiment, the light emitting element 2 capable of emitting blue light, a fluorescent substance capable of being excited by the blue light to emit green light, and a fluorescent substance capable of emitting red light are used together, so that white light with excellent color rendering properties can be obtained. For the fluorescent substance capable of emitting red light, a fluorescent substance such as $(Ca_{1-x}Sr_x)Al B_y SiN_{3+y}$:Eu ($0 \leq x \leq 1.0$, $0 \leq y \leq 0.5$) or $(Ca_{1-z}Sr_z)_2Si_5N_8$:Eu ($0 \leq z \leq 1.0$) can be used together with the fluorescent substance according to the present embodiment. Using combinations of these fluorescent substances capable of emitting red light enables an increase of the half wavelengths of the component lights corresponding to the three primary colors of light, so that white light with a warmer color can be obtained.

Examples of other fluorescent substances which can be used together include fluorescent substances capable of emitting red light such as oxysulfide-based fluorescent substances activated with Eu, such as $(La, Y)_2O_2S$:Eu, sulfide fluorescent substances activated with Eu, such as $(Ca, Sr)S$:Eu, aluminate fluorescent substances activated with Ce such as $(Y, Tb, Gd)_3Al_5O_{12}$:Ce, halophosphate fluorescent substances activated with Eu and Mn such as $(Sr, Ca, Ba, Mg)_{10}(PO_4)_6Cl_2$:Eu, Mn, oxide fluorescent substances activated with Ce such as $Lu_2CaMg_2(Si, Ge)_3O_{12}$:Ce, and oxinitride fluorescent substances activated with Eu such as α-type sialon fluorescent substances.

Examples of fluorescent substances capable of emitting green light include silicate fluorescent substances such as $(Ca, Sr, Ba)_2SiO_4$:Eu and $Ca_3Sc_2Si_3O_{12}$:Ce, chlorosilicate fluorescent substances such as $Ca_8MgSi_4O_{16}Cl_{2-\delta}$:Eu, Mn, oxynitride fluorescent substances such as $(Ca,Sr,Ba)_3Si_6O_9N_4$:Eu, $(Ca,Sr,Ba)_3Si_6O_{12}N_2$:Eu, $(Ca,Sr,Ba)Si_2O_2N_2$:Eu, $CaSc_2O_4$:Ce, and β-type sialone fluorescent substances, aluminate fluorescent substances activated with Ce such as $Y_3(Al,Ga)_5O_{12}$:Ce, and sulfide fluorescent substances activated with Eu such as $SrGa_2S_4$:Eu.

Examples of fluorescent substances capable of emitting blue light include aluminate fluorescent substances activated with Eu such as $(Sr,Ca,Ba)Al_2O_4$:Eu, $(Sr,Ca,Ba)_4Al_{14}O_{25}$:Eu, $(Ba,Sr,Ca)MgAl_{10}O_{17}$:Eu, $BaMgAl_{14}O_{25}$:Eu,Tb,Sm, aluminate fluorescent substances activated with Eu and Mn such as $(Ba,Sr,Ca)MgAl_{10}O_{17}$:Eu,Mn, thiogalle fluorescent substances activated with Ce such as $SrGa_2S_4$:Ce, $CaGa_2S_4$:Ce, and halophosphate fluorescent substances activated with Eu such as $(Sr,Ca,Ba,Mg)_{10}(PO_4)_6Cl_2$:Eu.

(Sealing Member)

The sealing member 18 is formed by filling a light transmissive resin so as to cover the light emitting element 2 mounted in the recess of the light emitting device 60. A silicone resin composition is preferably used for the light transmissive resin, but an insulating resin composition such as an epoxy resin composition and an acrylic resin composition can also be used. The fluorescent substance 3 is contained in the sealing member 18, and an additive member can also be contained appropriately. For example, containing a light diffusing material allows lowering directivity from the light emitting element, so that the view angle can be increased.

Examples 1 to 17 of the fluorescent substances according to the present invention will be shown below. In Examples 1 to 17, strontium carbonate ($SrCO_3$), aluminum nitride (AlN), silicon nitride ($Si_3N_4$), and europium oxide ($Eu_2O_3$) were used in all the examples as raw materials, which were weighed to provide the respective feed composition ratios as shown below to obtain each of the fluorescent substances. Herein, the following examples are intended as illustrative of a fluorescent substance and a method of manufacturing the fluorescent substance that are representative of the technology behind the present invention, thus, the invention is not limited to the fluorescent substance and the method of manufacturing the fluorescent substance described below.

EXAMPLES 1 to 4

The feed composition ratio of the fluorescent substance according to Example 1 is $Sr_{0.9}Eu_{0.1}Al_2Si_4ON_{7.33}$. Specifically, powders of $SrCO_3$, AlN, $Si_3N_4$, and $Eu_2O_3$ were used as raw materials, and each raw material was weighed to satisfy the molar ratio of $SrCO_3$:AlN:$Si_3N_4$:$Eu_2O_3$=0.9:2.0:1.33:0.1. More specifically, each raw material was weighed as shown below. Herein, the purity of each raw material of the fluorescent substance is assumed as 100%.

$SrCO_3$ . . . 15.84 g
AlN . . . 9.77 g
$Si_3N_4$ . . . 22.29 g
$Eu_2O_3$ . . . 2.10 g

The weighed raw materials as described above were well mixed by dray ball milling, and then the mixture was loaded in a furnace and fired in a reducing atmosphere of nitrogen and hydrogen at about 1600° C. for about 20 hours. Thus, a fluorescent substance with the feed composition ratio of $Sr_{0.9}Eu_{0.1}Al_2Si_4ON_{7.33}$ was obtained. An example of the reaction formula for generation of the fluorescent substance of Example 1 is shown in the Reaction Formula 1 below.

$3SrCO_3+6AlN+4Si_3N_4+aEu_2O_3 \rightarrow 3SrAl_2Si_4ON_{7.33}$:Eu+$3CO_2$  Reaction Formula 1

Here, the formula shown above is a theoretical formula assuming the reaction proceeds without any loss of elements contained in the raw materials. The fluorescent substance according to the present embodiment has a composition different than that in the reaction formula shown above, due to a partial loss of the elements in the process of sintering. As described later, after the sintering, an elemental analysis was carried out on the product. The resulting chemical formula was $Sr_{1.80}Eu_{0.20}Al_{4.15}Si_{7.03}O_{2.27}N_{12.42}$.

The fluorescent substances according to Examples 2 to 4 were obtained in the same manner as in Example 1, except that the firing was carried out for 40 hours, 60 hours, and 80 hours, respectively.

In Table 1, the measurement results of the feed composition ratio, firing time, chromaticity coordinates of emission color, brightness, and peak wavelength of emission spectrum of each fluorescent substance of Examples 1 to 4 are shown. Brightness in Table 1 is shown as a relative brightness with the brightness of $Ca_2Si_5N_8$:Eu of Comparative Example 1, described later, as 100%. Unless specifically stated, the fluorescent substances according to Examples shown below are excited by using an excitation light source having a peak wavelength at 460 nm to emit light.

TABLE 1

| | Feed Composition Ratio | Firing Time (h) | Chromaticity Coordinates | | Brightness (%) | Peak Wavelength (nm) |
| --- | --- | --- | --- | --- | --- | --- |
| | | | x | y | | |
| Example 1 | $Sr_{0.9}Eu_{0.1}Al_2Si_4ON_{7.33}$ | 20 | 0.533 | 0.458 | 91.5 | 601 |
| Example 2 | $Sr_{0.9}Eu_{0.1}Al_2Si_4ON_{7.33}$ | 40 | 0.543 | 0.448 | 102.9 | 608 |
| Example 3 | $Sr_{0.9}Eu_{0.1}Al_2Si_4ON_{7.33}$ | 60 | 0.550 | 0.442 | 105.0 | 608 |
| Example 4 | $Sr_{0.9}Eu_{0.1}Al_2Si_4ON_{7.33}$ | 80 | 0.551 | 0.441 | 100.6 | 609 |

X-ray diffraction patterns of the fluorescent substances according to Examples 1 to 4 are shown in FIG. 1.

The values of intensity of the respective diffraction peaks corresponding to the Bragg angle ranges shown in Table 2 are shown in each of the X-ray diffraction patterns. The intensity of the diffraction peaks are shown as relative intensity with respect to the intensity of the diffraction peak in the Bragg angle range of 17.9° to 18.5° as 100%.

Thermal properties of the fluorescent substances according to Examples 1 to 4 are shown in Table 3. The brightness shown in the table is relative brightness based on the brightness of the fluorescent substance according to each Example under conditions at about 25° C. being evaluated to be 100%.

TABLE 2

| 2θ/θ (°) | 17.9-18.5 | 24.5-25.1 | 29.0-29.6 | 29.6-30.2 | 30.6-31.2 | 31.4-32.0 | 34.8-35.4 | 35.7-36.3 | 47.9-48.5 | 68.7-69.3 |
| --- | --- | --- | --- | --- | --- | --- | --- | --- | --- | --- |
| Example 1 | 100.0 | 214.2 | 175.1 | 265.7 | 243.2 | 582.8 | 452.7 | 414.8 | 214.8 | 242.6 |
| Example 2 | 100.0 | 217.0 | 182.5 | 91.3 | 246.6 | 402.0 | 449.6 | 440.3 | 205.9 | 220.9 |
| Example 3 | 100.0 | 259.6 | 190.9 | 95.5 | 248.6 | 363.2 | 473.2 | 462.3 | 209.1 | 235.5 |
| Example 4 | 100.0 | 264.5 | 170.6 | 69.7 | 274.5 | 361.5 | 459.3 | 440.7 | 210.4 | 232.9 |

The results show a decrease in the intensity of the diffraction peaks in the Bragg angle range of 31.4° to 32.0° in the fluorescent substances of Examples 2 to 4 compared to that of the fluorescent substance of Example 1. This indicates that the intensity of the diffraction peaks in the Bragg angle range of 17.9° to 18.5° is enhanced with respect to the refraction peaks in the Bragg angle range of 31.4° to 32.0°.

TABLE 3

| | Temperature (° C.) | Brightness (%) |
| --- | --- | --- |
| Example 1 | 25 | 100 |
| | 100 | 88 |
| | 200 | 62.3 |

TABLE 3-continued

|  | Temperature (° C.) | Brightness (%) |
|---|---|---|
| Example 2 | 25 | 100 |
|  | 100 | 90.1 |
|  | 200 | 63.3 |
| Example 3 | 25 | 100 |
|  | 100 | 90.4 |
|  | 200 | 63.5 |
| Example 4 | 25 | 100 |
|  | 100 | 89.7 |
|  | 200 | 62.9 |

The results shown above indicate that the fluorescent substances of Examples 1 to 4 maintain the brightness of 88% or greater in the case where the emission is obtained under a condition with an elevated temperature at about 100° C. and of 62% or greater in the case where the emission is obtained under a condition with an elevated temperature at about 200° C., indicating excellent thermal properties.

The results of the elemental analysis of the fluorescent substances according to Examples 1 to 4 are shown in Table 4. The values obtained by the elemental analysis are shown in weight percent (wt %). Here, the measurement was carried out on each element separately so that small deviations may occur in the values obtained by the elemental analysis. Therefore, the sum of wt % values of all elements constituting each fluorescent substance of Examples 1 to 4 may not exactly be 100%.

TABLE 4

|  | Sr | Eu | Al | Si | O | N |
|---|---|---|---|---|---|---|
| Example 1 | 22.1 | 4.3 | 15.7 | 27.7 | 5.1 | 24.4 |
| Example 2 | 22.5 | 4.5 | 17.7 | 26.3 | 3.5 | 26.8 |
| Example 3 | 21.0 | 4.5 | 19.5 | 26.6 | 2.3 | 27.5 |
| Example 4 | 19.7 | 4.2 | 19.5 | 27.8 | 2.1 | 28.2 |

The calculated lattice constants of the fluorescent substances according to Examples 2 to 4 are shown in Table 5.

TABLE 5

|  | a | b | c |
|---|---|---|---|
| Example 2 | 5.00 | 7.17 | 11.60 |
| Example 3 | 5.00 | 7.20 | 11.71 |
| Example 4 | 4.97 | 7.16 | 11.63 |

The calculated chemical formulas according to Examples 1 to 4 are shown in Table 6.

TABLE 6

| | Calculated Chemical Formula (Sr + Eu = 2) |
|---|---|
| Example 1 | $Sr_{1.80}Eu_{0.20}Al_{4.15}Si_{7.03}O_{2.27}N_{12.42}$ |
| Example 2 | $Sr_{1.79}Eu_{0.21}Al_{4.58}Si_{6.54}O_{1.53}N_{13.36}$ |
| Example 3 | $Sr_{1.78}Eu_{0.22}Al_{5.37}Si_{7.03}O_{1.07}N_{14.58}$ |
| Example 4 | $Sr_{1.78}Eu_{0.22}Al_{5.73}Si_{7.84}O_{1.04}N_{15.95}$ |

The results show that the fluorescent substances according to Examples 1 to 4 all show high brightness. Upon excitation by a light emitting element emitting blue light with a peak wavelength at 460 nm, the fluorescent substances emitted red light with a peak wavelength in a range of 601 nm to 609 nm. Also, due to a difference in the firing time, the composition ratios of the corresponding fluorescent substances after firing also differ.

COMPARATIVE EXAMPLE 1

A fluorescent substance, $Ca_2Si_5N_8$:Eu, capable of emitting yellow to red light is shown as Comparative Example 1. In Comparative Example 1, the concentration of Eu is 0.06, which gives $Ca_{1.94}Si_5N_8$:$Eu_{0.06}$. In Table 7 below, the measurement results of color coordinates of the emission, brightness, and peak wavelength of emission spectrum on the fluorescent substance of Comparative Example 1 are shown.

TABLE 7

|  | Feed Composition Ratio | Chromaticity Coordinates | | Brightness (%) | Peak Wavelength (nm) |
|---|---|---|---|---|---|
|  |  | x | y |  |  |
| Comparative Example 1 | $Ca_2Si_5N_8$:Eu | 0.597 | 0.397 | 100.0 | 610 |

Figure 2:
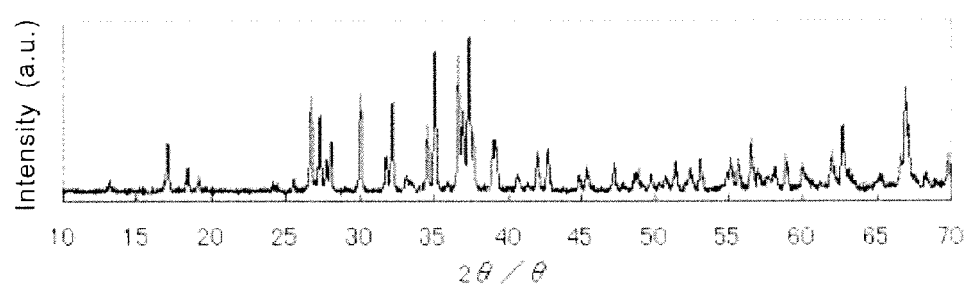
FIG. 2 shows a measurement result of X-ray diffraction pattern of the fluorescent substance according to Comparative Example 1.

The X-ray diffraction pattern of the fluorescent substance of Comparative Example 1 is shown in FIG. 2. The intensity of the respective diffraction peaks corresponding to the Bragg angle ranges shown in Table 8 are shown in the X-ray diffraction pattern. The intensity of the diffraction peaks are shown as relative intensity with respect to the intensity of the diffraction peak in the Bragg angle range of 17.9° to 18.5° as 100%.

TABLE 8

| 2θ/θ (°) | 17.9-18.5 | 24.5-25.1 | 29.0-29.6 | 29.6-30.2 | 30.6-31.2 | 31.4-32.0 | 34.8-35.4 | 35.7-36.3 | 47.9-48.5 | 68.7-69.3 |
|---|---|---|---|---|---|---|---|---|---|---|
| Comparative Example 1 | 100.0 | 40.1 | 42.6 | 326.5 | 38.3 | 134.6 | 452.5 | 60.5 | 75.3 | 67.9 |

The result shows that, in the fluorescent substance of Comparative Example 1, the intensity of the diffraction peak in the Bragg angle range of 24.5° to 25.1° is 40.1%. In contrast, in the fluorescent substances of Examples 1 to 4, the intensity of the diffraction peaks in the Bragg angle range of 24.5° to 25.1° is greater than 200% in all the cases. As show above, the fluorescent substances of Examples 1 to 4 have different X-ray diffraction peaks than that of the fluorescent substance of Comparative Example 1. The thermal property according to Comparative Example 1 is shown in Table 9. The brightness shown in the table is relative brightness based on the brightness of the fluorescent substance according to each Example under conditions at about 25° C. being evaluated to be 100%.

TABLE 9

| | Temperature (° C.) | Brightness (%) |
|---|---|---|
| Comparative Example 1 | 25 | 100.0 |
| | 100 | 87.5 |
| | 200 | 43.9 |

The fluorescent substance of Comparative Example 1 maintains a brightness of 87.5% in the case where the emission is obtained with an elevated temperature at about 100° C. However, the brightness decreases to 43.9% with an elevated temperature at about 200° C.

Figure 3:
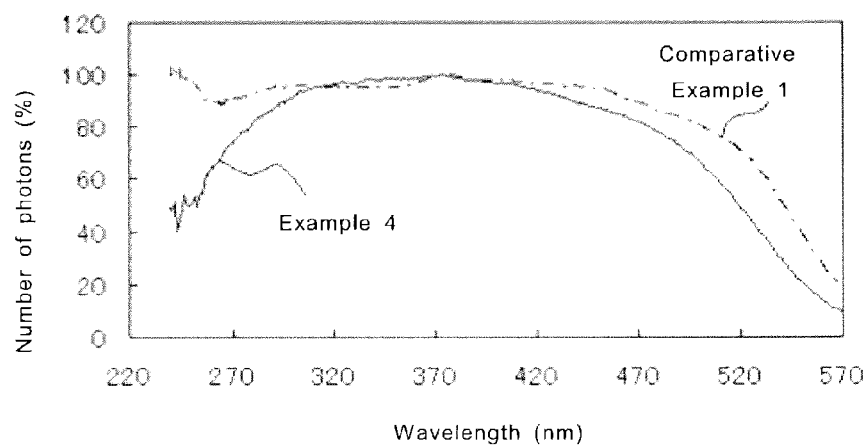
FIG. 3 shows excitation spectra of fluorescent substances according to Example 4 and Comparative Example 1.
Figure 4:
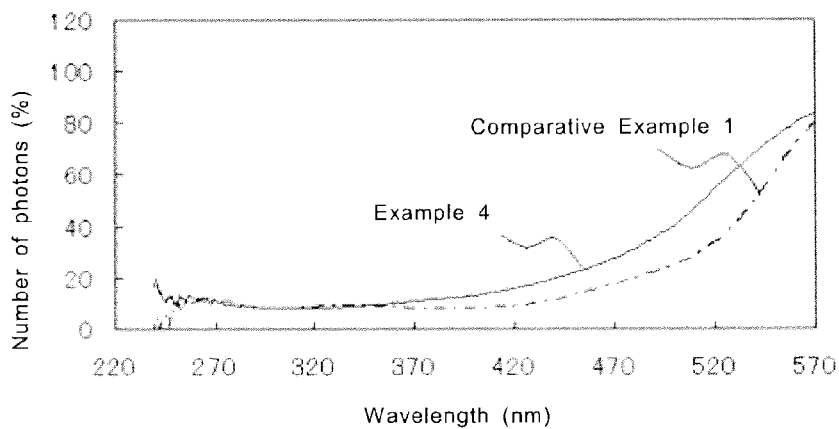
FIG. 4 shows reflectance spectra of fluorescent substances according to Example 4 and Comparative Example 1.
Figure 5:
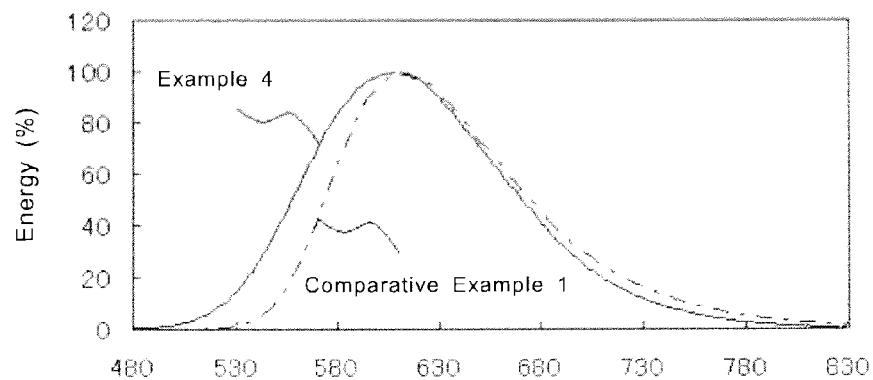
FIG. 5 shows emission spectra, excited at 460 nm, of fluorescent substances according to Example 4 and Comparative Example 1.
Figure 6:
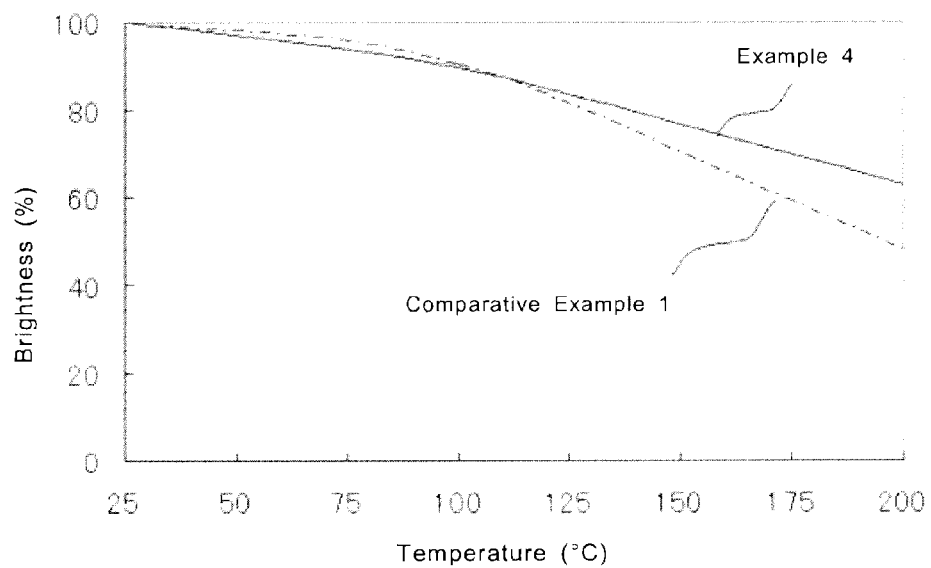
FIG. 6 shows thermal property of fluorescent substances according to Example 4 and Comparative Example 1.

FIG. 3 shows excitation spectra of fluorescent substances according to Example 4 and Comparative Example 1. FIG. 4 shows excitation spectra of fluorescent substances according to Example 4 and Comparative Example 1. FIG. 5 shows emission spectra, excited at 460 nm, of fluorescent substances according to Example 4 and Comparative Example 1. FIG. 6 shows thermal properties of fluorescent substances according to Example 4 and Comparative Example 1.

EXAMPLES 5 to 11

The fluorescent substances according to Examples 5 to 11 were obtained in the same manner as in Example 1, except that the raw materials were weighed to satisfy the predetermined feed composition ratios. In Examples 5 to 11, the feed composition ratios for $Sr_aAl_bSi_cO_dN_e$:Eu are changed within a range of $(Sr+Eu):(Al+Si)=2:4.5$ to 6.0. In Table 9, the measurement results of the feed composition ratio, chromaticity coordinates of emission color, brightness, and peak wavelength of emission spectrum of each fluorescent substance of Examples 5 to 11 are shown. Brightness shown in the table is a relative brightness with the brightness of the fluorescent substance of Comparative Example 1 as 100%.

TABLE 10

| | Feed Composition Ratio | Chromaticity Coordinates x | Chromaticity Coordinates y | Brightness (%) | Peak Wavelength (nm) |
|---|---|---|---|---|---|
| Example 5 | $Sr_{0.9}Eu_{0.1}Al_{1.125}Si_{3.375}ON_{5.63}$ | 0.549 | 0.442 | 95.4 | 609 |
| Example 6 | $Sr_{0.9}Eu_{0.1}Al_{1.250}Si_{3.750}ON_{6.25}$ | 0.539 | 0.453 | 96.7 | 601 |
| Example 7 | $Sr_{0.9}Eu_{0.1}Al_{1.375}Si_{4.125}ON_{6.88}$ | 0.538 | 0.454 | 108.8 | 601 |
| Example 8 | $Sr_{0.9}Eu_{0.1}Al_{1.5}Si_{4.5}ON_{7.5}$ | 0.536 | 0.456 | 101.7 | 595 |
| Example 9 | $Sr_{0.9}Eu_{0.1}Al_{1.625}Si_{4.875}ON_{8.13}$ | 0.527 | 0.463 | 73.7 | 594 |
| Example 10 | $Sr_{0.9}Eu_{0.1}Al_{2.4}Si_{3.2}ON_{6.67}$ | 0.539 | 0.451 | 79.6 | 606 |
| Example 11 | $Sr_{0.9}Eu_{0.1}Al_3Si_3ON_7$ | 0.534 | 0.455 | 77.0 | 601 |

Figure 7:
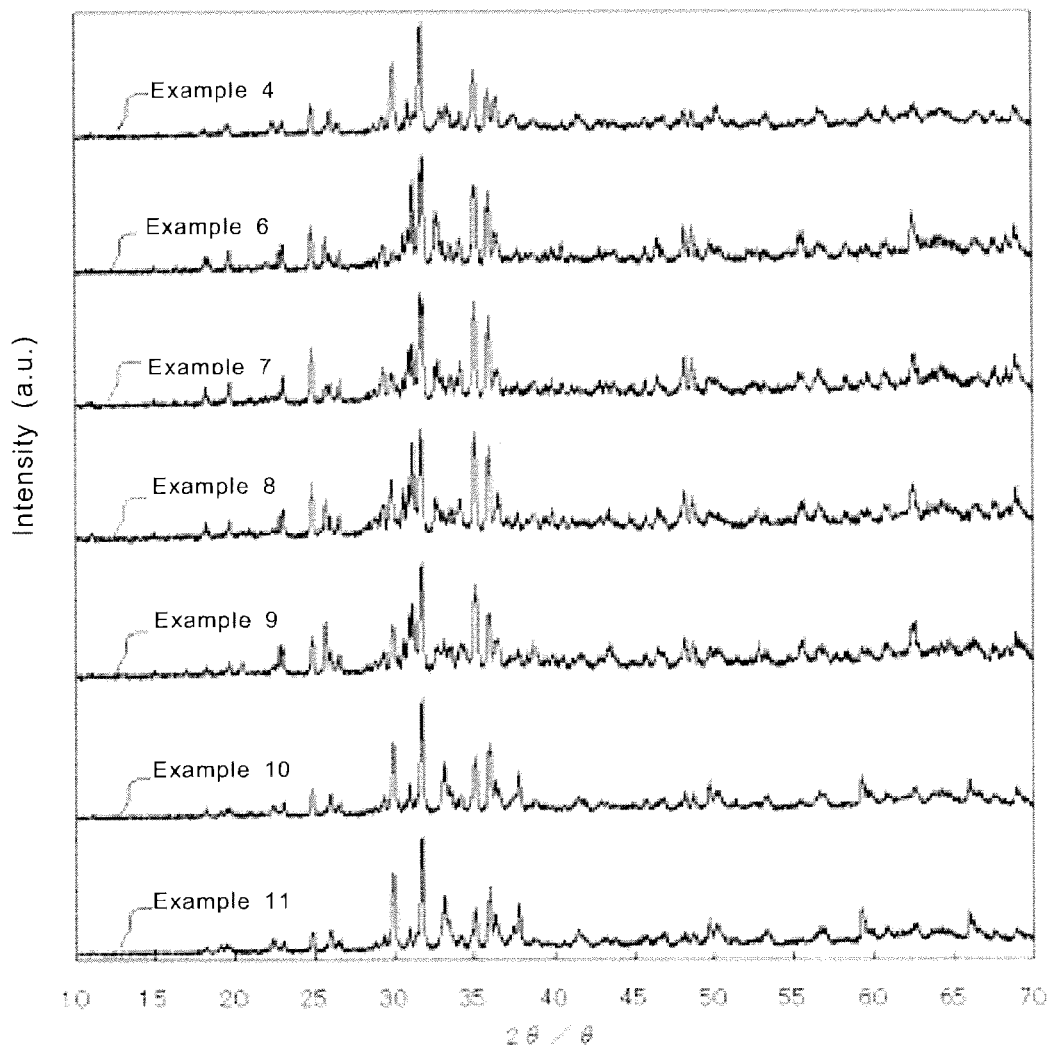
FIG. 7 shows measurement results of X-ray diffraction patterns of the fluorescent substances according to Examples 5 to 11.

X-ray diffraction patterns of the fluorescent substances according to Examples 5 to 11 are shown in FIG. 7.

The intensity of the respective diffraction peaks corresponding to the Bragg angle ranges shown in Table 11 are shown in the X-ray diffraction pattern. The intensity of the diffraction peaks are shown as relative intensity with respect to the intensity of the diffraction peak in the Bragg angle range of 17.9° to 18.5° as 100%.

TABLE 11

| 2θ/θ (°) | 17.9-18.5 | 24.5-25.1 | 29.0-29.6 | 29.6-30.2 | 30.6-31.2 | 31.4-32.0 | 34.8-35.4 | 35.7-36.3 | 47.9-48.5 | 68.7-69.3 |
|---|---|---|---|---|---|---|---|---|---|---|
| Example 5 | 100.0 | 254.9 | 181.9 | 493.1 | 288.9 | 788.2 | 480.6 | 354.9 | 222.9 | 250.0 |
| Example 6 | 100.0 | 212.0 | 139.7 | 115.2 | 385.3 | 413.0 | 367.4 | 339.1 | 210.3 | 218.5 |
| Example 7 | 100.0 | 221.8 | 162.9 | 141.6 | 240.6 | 397.6 | 372.8 | 319.8 | 194.1 | 202.5 |
| Example 8 | 100.0 | 232.8 | 159.6 | 239.9 | 386.4 | 423.5 | 407.1 | 361.8 | 206.0 | 222.4 |
| Example 9 | 100.0 | 250.0 | 172.8 | 311.0 | 411.8 | 620.6 | 504.4 | 363.2 | 244.9 | 272.8 |
| Example 10 | 100.0 | 207.8 | 171.9 | 442.6 | 229.4 | 694.1 | 371.9 | 435.4 | 188.0 | 211.4 |
| Example 11 | 100.0 | 202.2 | 182.5 | 624.2 | 235.8 | 884.0 | 381.8 | 524.9 | 197.1 | 229.9 |

The results shown above indicate that the fluorescent substances according to Example 7 achieved high brightness.

EXAMPLES 12 to 17

The fluorescent substances according to Examples 12 to 17 were obtained in the same manner as in Example 1, except that the raw materials were weighed so that the concentration of Eu with respect to Sr becomes a predetermined concentration. Table 12 shows the measurement results of the feed composition ratio, Eu concentration, chromaticity coordinates of emission color, brightness, and peak wavelength of emission spectrum. Brightness shown in the table is a relative brightness with the brightness of the fluorescent substance of Example 15 as 100%.

TABLE 12

| | Feed Composition Ratio | Eu Concentration (%) | Chromaticity Coordinates x | Chromaticity Coordinates y | Brightness (%) | Peak Wavelength (nm) |
|---|---|---|---|---|---|---|
| Example 12 | $Sr_{0.96}Eu_{0.04}Al_2Si_4ON_{7.33}$ | 4 | 0.499 | 0.486 | 67.7 | 593 |
| Example 13 | $Sr_{0.94}Eu_{0.06}Al_2Si_4ON_{7.33}$ | 6 | 0.515 | 0.472 | 82.0 | 594 |

TABLE 12-continued

| | Feed Composition Ratio | Eu Concentration (%) | Chromaticity Coordinates x | Chromaticity Coordinates y | Brightness (%) | Peak Wavelength (nm) |
|---|---|---|---|---|---|---|
| Example 14 | $Sr_{0.92}Eu_{0.08}Al_2Si_4ON_{7.33}$ | 8 | 0.523 | 0.465 | 94.4 | 601 |
| Example 15 | $Sr_{0.90}Eu_{0.10}Al_2Si_4ON_{7.33}$ | 10 | 0.530 | 0.459 | 100.0 | 601 |
| Example 16 | $Sr_{0.88}Eu_{0.12}Al_2Si_4ON_{7.33}$ | 12 | 0.534 | 0.455 | 95.3 | 601 |
| Example 17 | $Sr_{0.86}Eu_{0.14}Al_2Si_4ON_{7.33}$ | 14 | 0.529 | 0.458 | 75.2 | 602 |

Table 13 shows the values of intensity of the diffraction peaks in the respective Bragg angle ranges in the X-ray diffraction patterns. The intensity of the diffraction peaks are shown as relative intensity with respect to the intensity of the diffraction peak in the Bragg angle range of 17.9° to 18.5° as 100%.

the fluorescent substances of Examples 12 to 17 emitted red light with a peak wavelength in a range of 593 nm to 602 nm. Higher brightness can be maintained with the Eu concentration of 6% to 12%, but concentration quenching may occur with the concentration exceeding 14% which may results in reduction of brightness. A longer peak wavelength can be obtained with increasing Eu concentration.

TABLE 13

| | XRD Peak Intensity 2θ/θ (°) | | | | | | | | | |
|---|---|---|---|---|---|---|---|---|---|---|
| | 17.9-18.5 | 24.5-25.1 | 29.0-29.6 | 29.6-30.2 | 30.6-31.2 | 31.4-32.0 | 34.8-35.4 | 35.7-36.3 | 47.9-48.5 | 68.7-69.3 |
| Example 12 | 100.0 | 204.2 | 218.1 | 553.5 | 308.3 | 913.9 | 418.8 | 414.6 | 216.7 | 213.2 |
| Example 13 | 100.0 | 255.3 | 183.0 | 505.0 | 320.6 | 866.0 | 471.6 | 453.9 | 239.0 | 246.8 |
| Example 14 | 100.0 | 228.3 | 185.5 | 460.5 | 271.7 | 783.6 | 413.2 | 415.1 | 215.8 | 225.7 |
| Example 15 | 100.0 | 202.3 | 155.1 | 368.7 | 245.5 | 640.3 | 392.6 | 374.4 | 188.6 | 213.1 |
| Example 16 | 100.0 | 228.4 | 182.4 | 429.1 | 287.2 | 734.5 | 407.4 | 393.2 | 218.9 | 231.1 |
| Example 17 | 100.0 | 192.9 | 167.5 | 576.2 | 294.4 | 922.2 | 363.5 | 372.2 | 219.8 | 251.6 |

The results of the elemental analysis of the fluorescent substances according to Examples 12 to 17 are shown in Table 14. The values obtained by the elemental analysis are shown in wt %. Here, the measurement was carried out on each element separately so that small deviations may occur in the values obtained by the elemental analysis. Therefore, the sum of wt % values of all elements constituting each fluorescent substance of Examples 12 to 17 may not exactly be 100%.

TABLE 14

| | Sr | Eu | Al | Si | O | N |
|---|---|---|---|---|---|---|
| Example 12 | 23.6 | 2.0 | 19.9 | 21.4 | 6.9 | 23.6 |
| Example 13 | 23.5 | 2.9 | 18.1 | 22.1 | 6.4 | 24.4 |
| Example 14 | 23.0 | 3.7 | 17.1 | 23.4 | 5.9 | 24.5 |
| Example 15 | 22.0 | 4.4 | 16.6 | 24.8 | 5.4 | 24.5 |
| Example 16 | 21.1 | 5.1 | 16.1 | 25.3 | 5.5 | 24.6 |
| Example 17 | 20.1 | 5.7 | 15.1 | 27.5 | 6.1 | 24.4 |

The calculated chemical formulas according to Examples 12 to 17 are shown in Table 15.

TABLE 15

| | Calculated Chemical Formula (Sr + Eu = 2) |
|---|---|
| Example 12 | $Sr_{1.91}Eu_{0.09}Al_{5.22}Si_{5.39}O_{3.05}N_{11.93}$ |
| Example 13 | $Sr_{1.87}Eu_{0.13}Al_{4.67}Si_{5.48}O_{2.78}N_{12.13}$ |
| Example 14 | $Sr_{1.83}Eu_{0.17}Al_{4.42}Si_{5.81}O_{2.57}N_{12.20}$ |
| Example 15 | $Sr_{1.79}Eu_{0.21}Al_{4.39}Si_{6.31}O_{2.41}N_{12.49}$ |
| Example 16 | $Sr_{1.76}Eu_{0.24}Al_{4.35}Si_{6.57}O_{2.51}N_{12.80}$ |
| Example 17 | $Sr_{1.72}Eu_{0.28}Al_{4.19}Si_{7.34}O_{2.86}N_{13.05}$ |

As a result, upon excitation by a light emitting element which emits blue light having a peak wavelength at 460 nm, EXAMPLES 18 to 20, COMPARATIVE EXAMPLE 2

Figure 10:
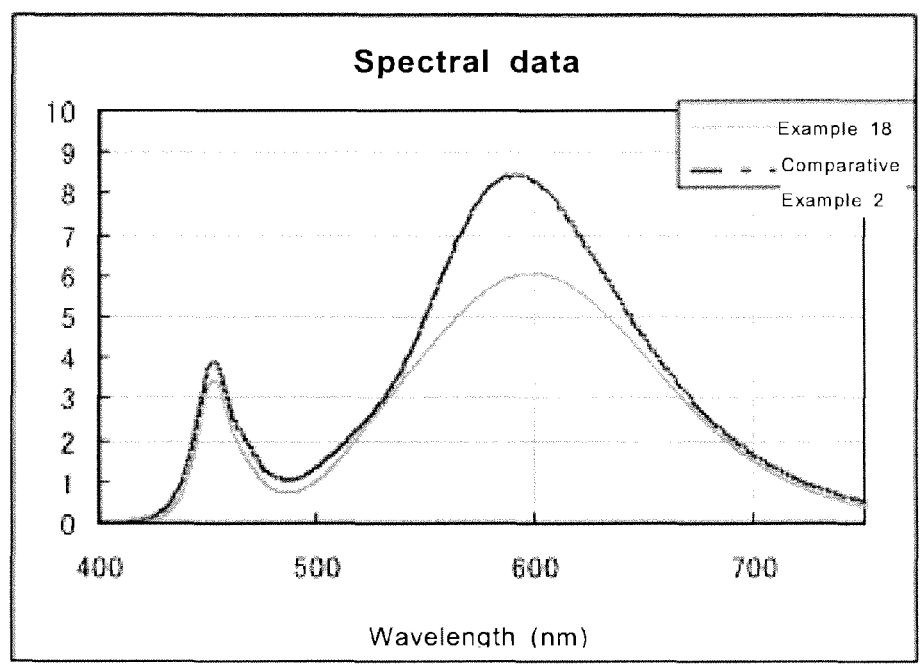
FIG. 10 shows an emission spectrum of a light emitting device according to Example 18.
Figure 11:
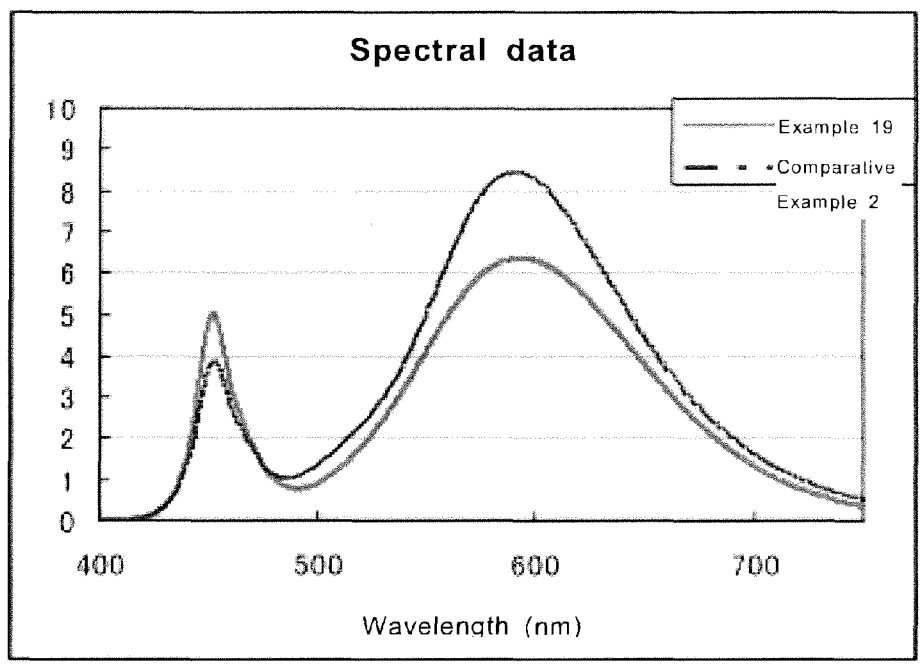
FIG. 11 shows an emission spectrum of a light emitting device according to Example 19.
Figure 12:
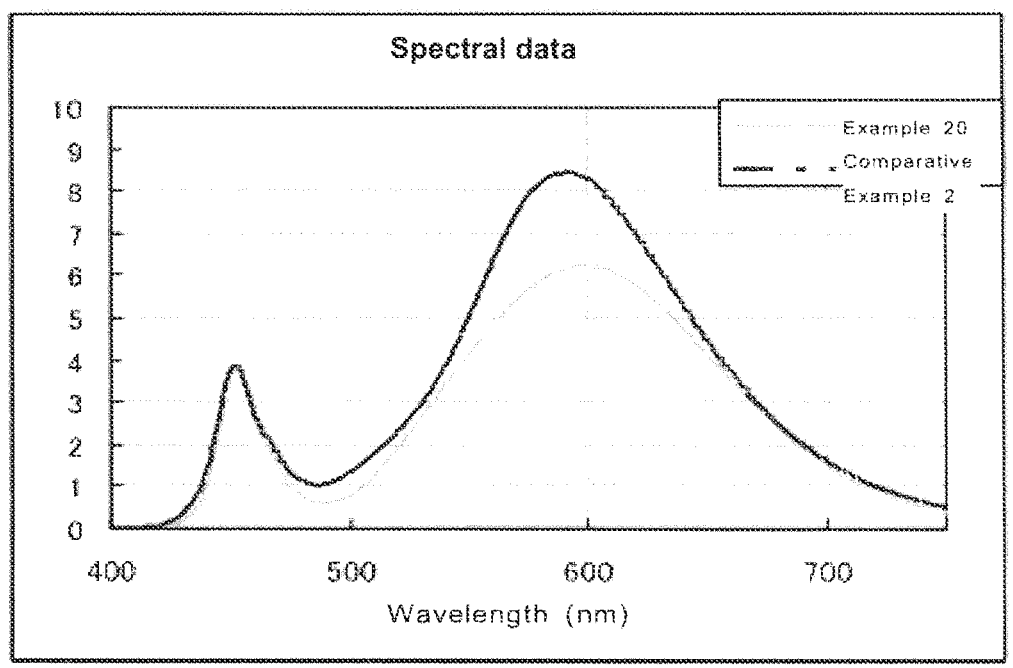
FIG. 12 shows an emission spectrum of a light emitting device according to Example 20.

In Example 18, a light emitting device capable of emitting white light was fabricated using a chrolosilicate fluorescent substance having a composition formula $Ca_{7.5}MgSi_4O_{16}Cl_{1.8}:Eu_{0.5}$ and a fluorescent substance of Example 4 represented by a composition formula $Sr_{1.78}Al_{5.73}Si_{7.84}O_{1.04}N_{15.95}:Eu_{0.22}$. In Example 19, a light emitting device capable of emitting white light was fabricated using a YAG fluorescent substance having a composition formula $Y_{2.96}(Al_{0.8}Ga_{0.2})_5O_{12}:Ce_{0.04}$ and a fluorescent substance of Example 4 represented by a composition formula $Sr_{1.78}Al_{5.73}Si_{7.84}O_{1.04}N_{15.95}:Eu_{0.22}$. In Example 20, a light emitting device capable of emitting white light was fabricated using a chrolosilicate fluorescent substance having a composition formula $(Sr_{0.45}Ba_{0.55})_{1.93}SiO_4:Eu_{0.07}$ and a fluorescent substance of Example 4 represented by a composition formula $Sr_{1.78}Al_{5.73}Si_{7.84}O_{1.04}N_{15.95}:Eu_{0.22}$. As Comparative Example 2, a light emitting device capable of emitting white light was fabricated using a YAG fluorescent substance having a composition formula $Y_{2.96}(Al_{0.8}Ga_{0.2})_5O_{12}:Ce_{0.04}$ and a nitride fluorescent substance of Comparative Example having a composition formula $Ca_{1.94}Si_5N_8:Eu_{0.06}$. Table 16 shows light emitting properties of the light emitting devices of Examples 18 to 20 and Comparative Example 2. FIG. 10 shows an emission spectrum of a light emitting device according to Example 18. FIG. 11 shows an emission spectrum of a light emitting device according to Example 19. FIG. 12 shows an emission spectrum of a light emitting device according to Example 20.

TABLE 16

| | Fluorescent Substance A | Fluorescent Substance B | Input Current cur(mA) | Voltage vol(V) | Iv (cd) | Chromaticity Coordinates | | Color Temperature Tcp(K) | Ra |
|---|---|---|---|---|---|---|---|---|---|
| | | | | | | x | y | | |
| Example 18 | $Ca_{7.5}MgSi_4O_{16}Cl_{1.8}:Eu_{0.5}$ | Example 4 | 20 | 3.07 | 1.37 | 0.455 | 0.413 | 2821 | 74.9 |
| Example 19 | $Y_3(Al_{0.5}Ga_{0.2})_5O_{12}:Ce_{0.04}$ | | 20 | 3.07 | 1.38 | 0.439 | 0.385 | 2847 | 71.5 |
| Example 20 | $(Sr_{0.45}Ba_{0.55})_{1.93}SiO_4:Eu_{0.07}$ | | 20 | 3.08 | 1.37 | 0.458 | 0.407 | 2739 | 72.9 |
| Comparative Example 2 | $Y_{2.96}(Al_{0.8}Ga_{0.2})_5O_{12}:Ce_{0.04}$ | Comparative Example 1 | 20 | 3.05 | 1.76 | 0.462 | 0.413 | 2727 | 67.6 |

As a result, the white-light emitting devices of Examples 18 to 20 all exhibited higher color rendering property (Ra) compared to that of Comparative Example 2. As described above, the fluorescent substance of Example 4 has superior thermal properties as compared to Comparative Example 1, therefore, also in the cases where the fluorescent substance is incorporated in a light emitting device as in Examples 18 to 20, longer operation life compared to the light emitting device of Comparative Example 2 and higher reliability can be achieved.

EXAMPLES 21, 22

The fluorescent substances of Examples 21 and 22 were obtained in the same manner as in Example 1 using $SrCO_3$, AlN, $Al_2O_3$, $Si_3N_4$, and $Eu_2O_3$ powders as raw materials to satisfy the predetermined feed composition ratio. However, the firing time was greatly reduced to 5 hours. In Examples 21 and 22, in $Sr_aAl_bSi_cO_dN_e$:Eu, the feed composition ratio of Al, O, and N is altered in a range of Al:O:N=2:0.4:5.87 and Al:O:N=1.25:0.35:515. In Table 17, the measurement results of the feed composition ratio, chromaticity coordinates of emission color, brightness, and peak wavelength of emission spectrum of each fluorescent substance of Examples 21 to 22 are shown. Brightness shown in the table is a relative brightness with the brightness of the fluorescent substance of Comparative Example 1 as 100%.

TABLE 17

| | Feed Composition Ratio | Firing Time (h) | Chromaticity Coordinates | | Brightness (%) | Peak Wavelength (nm) |
|---|---|---|---|---|---|---|
| | | | x | y | | |
| Example 21 | $Sr_{0.62}Eu_{0.08}Al_2Si_{2.75}O_{0.4}N_{5.87}$ | 5 | 0.549 | 0.443 | 101.8 | 609 |
| Example 22 | $Sr_{0.62}Eu_{0.08}Al_{1.25}Si_{2.75}O_{0.35}N_{5.15}$ | 5 | 0.553 | 0.440 | 119.3 | 608 |

Table 18 shows the values of intensity of the respective diffraction peaks corresponding to the Bragg angle ranges in the X-ray diffraction patterns. The intensity of the diffraction peaks are shown as relative intensity with respect to the intensity of the diffraction peak in the Bragg angle range of 17.9° to 18.5° as 100%.

TABLE 18

| | XRD Peak Intensity 2θ/θ (°) | | | | | | | | | |
|---|---|---|---|---|---|---|---|---|---|---|
| | 17.9-18.5 | 24.5-25.1 | 29.0-29.6 | 29.6-30.2 | 30.6-31.2 | 31.4-32.0 | 34.8-35.4 | 35.7-36.3 | 47.9-48.5 | 68.7-69.3 |
| Example 21 | 100.0 | 248.5 | 161.3 | 82.1 | 253.2 | 383.4 | 441.7 | 437.9 | 202.1 | 211.9 |
| Example 22 | 100.0 | 264.7 | 179.5 | 107.6 | 286.6 | 416.1 | 525.9 | 421.4 | 226.3 | 244.6 |

The results of the elemental analysis of the fluorescent substances according to Examples 21 to 22 are shown in Table 19. The values obtained by the elemental analysis are shown in weight percent (wt %). Here, the measurement was carried out on each element separately so that small deviations may occur in the values obtained by the elemental analysis. Therefore, the sum of weight % values of all elements constituting each fluorescent substance of Examples 21 and 22 may not exactly be 100%.

TABLE 19

| | Elemental Analysis (wt %) | | | | | |
|---|---|---|---|---|---|---|
| | Sr | Eu | Al | Si | O | N |
| Example 21 | 19.5 | 4.1 | 19.3 | 25.9 | 2.7 | 27.3 |
| Example 22 | 21.0 | 4.6 | 14.9 | 29.4 | 2.8 | 26.9 |

The calculated chemical formulas according to Examples 21 and 22 are shown in Table 20.

TABLE 20

| | Calculated Chemical Formula (Sr + Eu = 2) |
|---|---|
| Example 21 | $Sr_{1.78}Eu_{0.22}Al_{5.73}Si_{7.39}O_{1.35}N_{15.62}$ |
| Example 22 | $Sr_{1.78}Eu_{0.22}Al_{4.09}Si_{7.76}O_{1.30}N_{14.23}$ |

The results show that the fluorescent substances of Examples 21 and 22 have properties either equaling or surpassing that of other Examples and can be fabricated in a shorter time. It is considered that in the fluorescent substances of Examples 1 to 17, inessential elements were dispersed during a long firing time to form a most suitable composition, but in the fluorescent substances of Examples 21 and 22, the most suitable composition was directly aimed, so that a synthesis in a short time can be achieved. The molar ratio used in Examples 21 and 22 is (group II element M+Eu):Al:Si:O:N=2:4.0 to 5.8:7.3 to 7.8:1.3 to 1.4:14.0 to 15.7. The analysis result of XRD data of the fluorescent substance of Example 22 shows that the fluorescent substance of Example 22 belongs to orthorhombic system with a=11.647 Å, b=21.462 Å, c=4.975 Å.

EXAMPLES 23, 24

Figure 13:
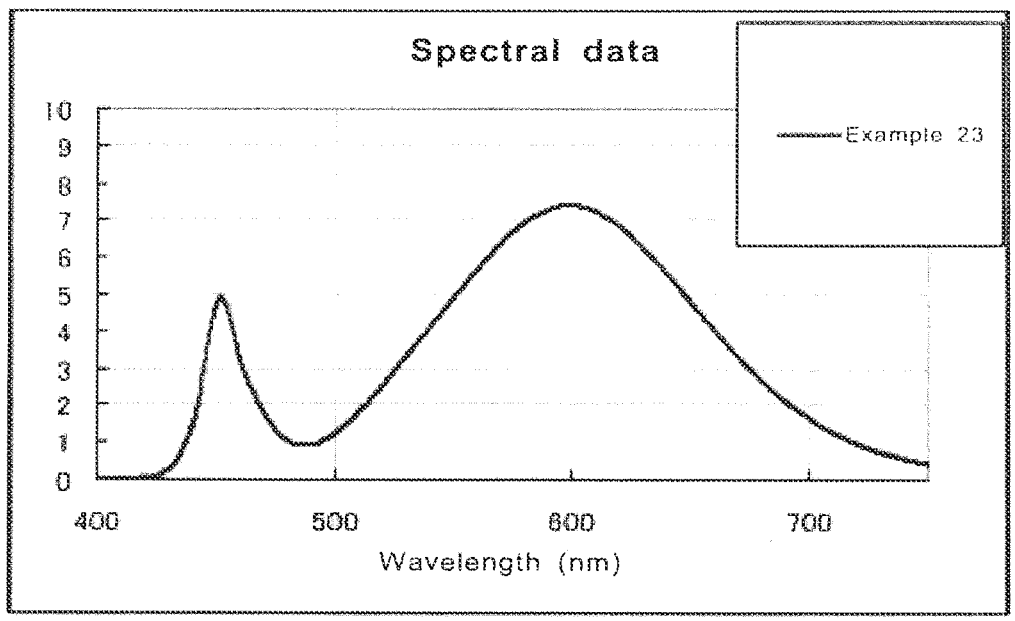
FIG. 13 shows an emission spectrum of a light emitting device according to Example 23.
Figure 14:
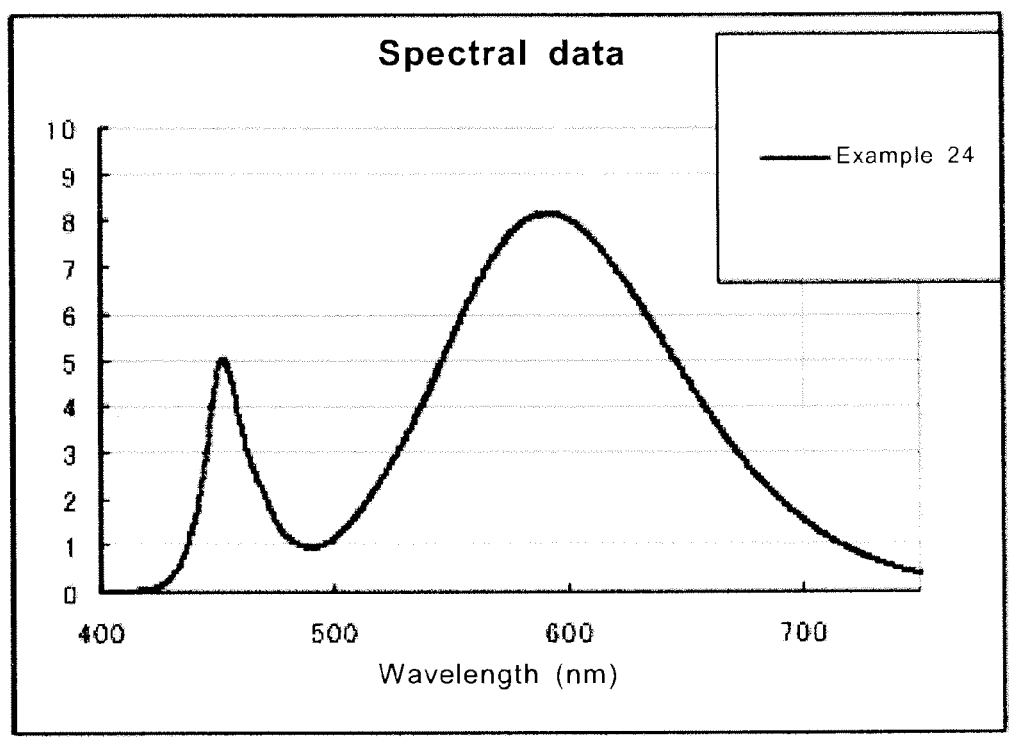
FIG. 14 shows an emission spectrum of a light emitting device according to Example 24.

In Example 23, a light emitting device capable of emitting white light was fabricated using a chrolosilicate fluorescent substance having a composition formula $Ca_{7.5}MgSi_4O_{16}Cl_{1.8}:Eu_{0.5}$ and a fluorescent substance of Example 22 represented by a composition formula $Sr_{1.78}Al_{4.09}Si_{7.76}O_{1.31}N_{14.25}:Eu_{0.22}$. In Example 24, a light emitting device capable of emitting white light was fabricated using a YAG fluorescent substance having a composition formula $Y_{2.96}(Al_{0.8}Ga_{0.2})_5O_{12}:Ce_{0.04}$ and a fluorescent substance of Example 22 represented by a composition formula $Sr_{1.78}Al_{4.09}Si_{7.76}O_{1.31}N_{14.25}:Eu_{0.22}$. Thermal properties of the fluorescent substances according to Examples 23 to 24 are shown in Table 21. FIG. 13 shows emission spectrum of a light emitting device according to Example 23. FIG. 14 shows an emission spectrum of a light emitting device according to Example 24.

TABLE 21

| | Fluorescent Substance A | Fluorescent Substance B | Input Current cur(mA) | Voltage vol(V) | Iv (cd) | Chromaticity Coordinates x | Chromaticity Coordinates y | Color Temperature Tcp(K) | Ra |
|---|---|---|---|---|---|---|---|---|---|
| Example 23 | $Ca_{7.5}MgSi_4O_{16}Cl_{1.8}:Eu_{0.5}$ | Example 22 | 20 | 3.09 | 1.65 | 0.449 | 0.402 | 2830 | 75.2 |
| Example 24 | $Y_{2.96}(Al_{0.8}Ga_{0.2})_5O_{12}:Ce_{0.04}$ | | 20 | 3.06 | 1.79 | 0.450 | 0.405 | 2842 | 69.9 |

The result shows that the white-light emitting devices of Examples 23 and 24 both exhibited higher color rendering property (Ra) compared to the white-light emitting device of Comparative Example 2.

EXAMPLES 25, 26

The fluorescent substances of Examples 25 and 26 were obtained in the same manner as in Example 1 except for weighing the powders of $SrCO_3$, AlN, $Al_2O_3$, $Si_3N_4$, and $Eu_2O_3$ as raw materials to satisfy the predetermined feed composition ratio. The firing time is 5 hours. In Table 22, the measurement results of the feed composition ratio, chromaticity coordinates of emission color, brightness, and peak wavelength of emission spectrum of each fluorescent substance of Examples 25 to 26 are shown. Brightness shown in the table is a relative brightness with the brightness of the fluorescent substance of Comparative Example 1 as 100%.

TABLE 22

| | Feed Composition Ratio | Firing Time (h) | Chromaticity Coordinates x | Chromaticity Coordinates y | Brightness (%) | Peak Wavelength (nm) |
|---|---|---|---|---|---|---|
| Example 25 | $Sr_{0.62}Eu_{0.08}Al_{1.25}Si_{2.75}O_{0.35}N_{5.15}$ | 5 | 0.556 | 0.437 | 114.0 | 609 |
| Example 26 | $Sr_{1.8}Eu_{0.2}Al_3Si_7O_1N_{13}$ | 5 | 0.554 | 0.439 | 115.4 | 609 |

Table 23 shows the values of intensity of the respective diffraction peaks corresponding to the Bragg angle ranges in the X-ray diffraction patterns respectively. The intensity of the diffraction peaks are shown as relative intensity with respect to the intensity of the diffraction peak in the Bragg angle range of 17.9° to 18.5° as 100%.

TABLE 23

| | XRD Peak Intensity 2θ/θ (°) | | | | | | | | | |
|---|---|---|---|---|---|---|---|---|---|---|
| | 17.9-18.5 | 24.5-25.1 | 29.0-29.6 | 29.6-30.2 | 30.6-31.2 | 31.4-32.0 | 34.8-35.4 | 35.7-36.3 | 47.9-48.5 | 68.7-69.3 |
| Example 25 | 100.0 | 266.8 | 176.5 | 104.0 | 269.9 | 392.5 | 483.2 | 426.5 | 214.2 | 248.2 |
| Example 26 | 100.0 | 260.1 | 173.7 | 101.8 | 244.3 | 403.9 | 475.9 | 388.6 | 203.5 | 219.7 |

The results of the elemental analysis of the fluorescent substances according to Examples 25 and 26 are shown in Table 24. The values obtained by the elemental analysis are shown in wt %. The measurement was carried out on each element separately so that small deviations may occur in the values obtained by the elemental analysis. Therefore, the sum of weight % values of all elements constituting each fluorescent substance of Examples 25 and 26 may not exactly be 100%.

TABLE 24

| | Elemental Analysis (wt %) | | | | | |
|---|---|---|---|---|---|---|
| | Sr | Eu | Al | Si | O | N |
| Example 25 | 24.9 | 4.8 | 13.5 | 28.3 | 2.9 | 26.7 |
| Example 26 | 27.0 | 4.5 | 12.3 | 28.0 | 3.5 | 25.6 |

The calculated chemical formulas according to Examples 25 and 26 are shown in Table 25.

TABLE 25

| | Calculated Chemical Formula (Sr + Eu = 2) |
|---|---|
| Example 25 | $Sr_{1.80}Eu_{0.20}Al_{3.17}Si_{6.38}O_{1.15}N_{12.07}$ |
| Example 26 | $Sr_{1.82}Eu_{0.18}Al_{2.70}Si_{5.90}O_{1.30}N_{10.82}$ |

Figure 15:
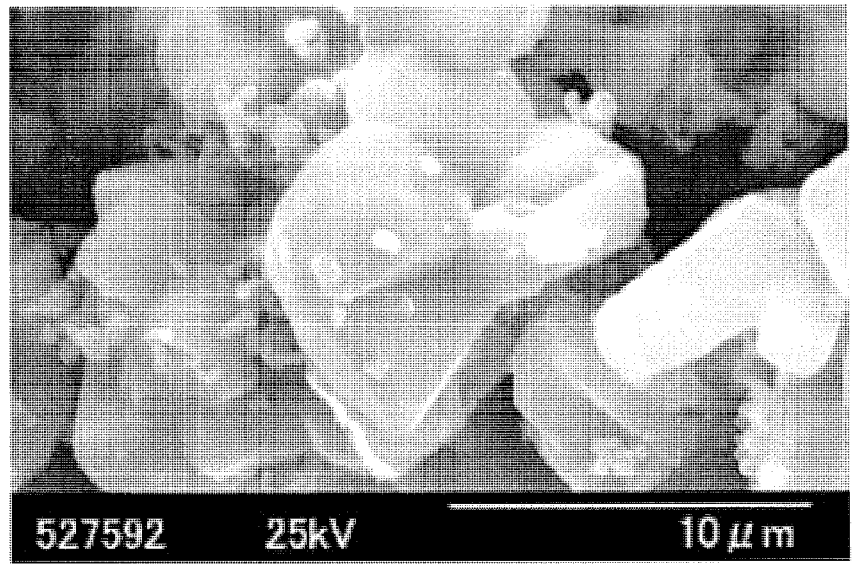
FIG. 15 is a SEM image of a fluorescent substance according to Example 25.
Figure 16:
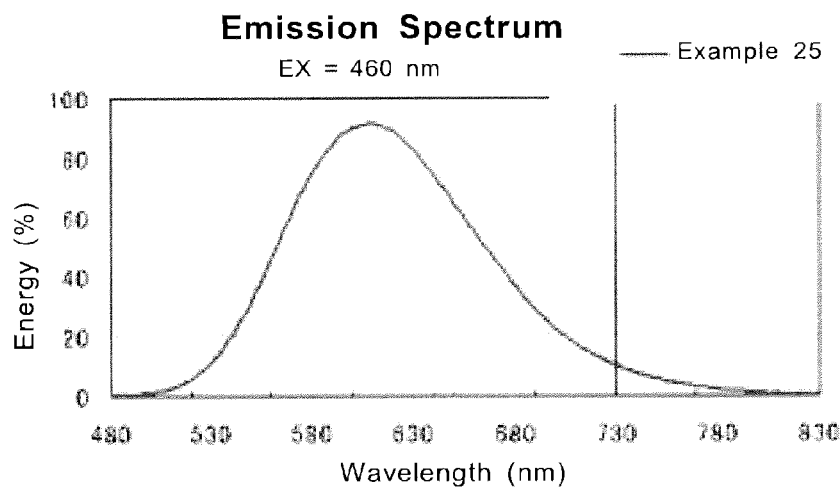
FIG. 16 shows an emission spectrum of a light emitting device according to Example 25.
Figure 17:
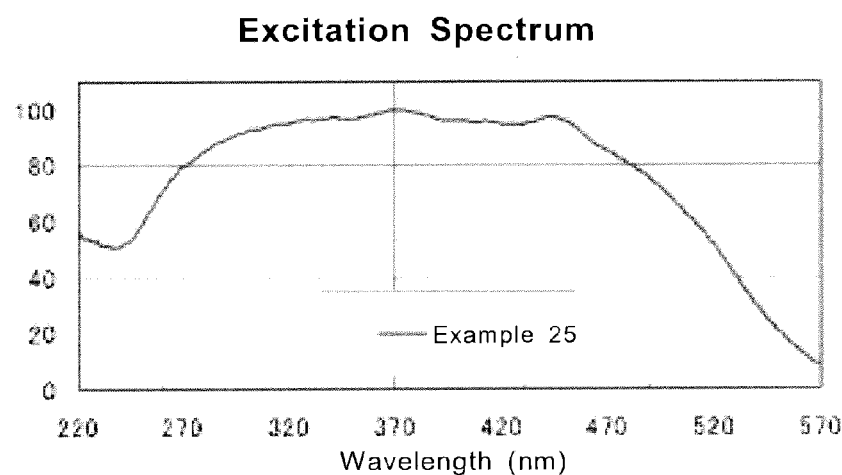
FIG. 17 shows an emission spectrum of a light emitting device according to Example 25.
Figure 18:
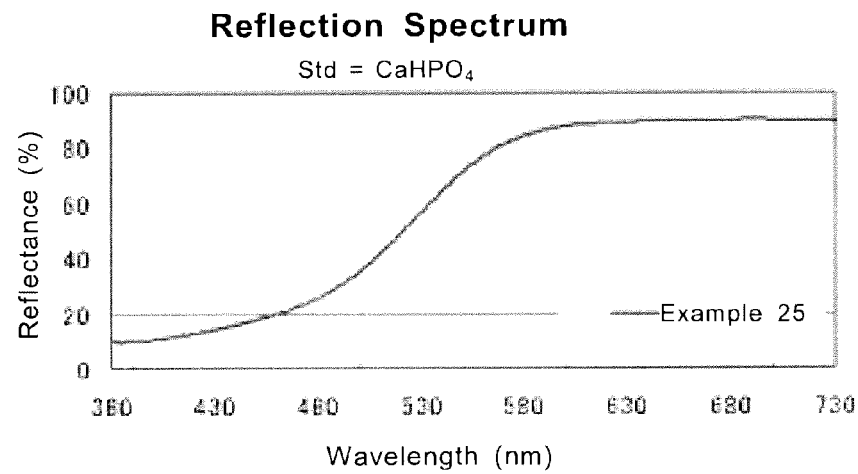
FIG. 18 shows a reflectance spectrum of a light emitting device according to Example 25.

FIG. 15 is a SEM image of a fluorescent substance according to Example 25. FIG. 16 shows an emission spectrum of a fluorescent substance according to Example 25. FIG. 17 shows an excitation spectrum of a fluorescent substance according to Example 25. FIG. 18 shows a reflectance spectrum of a fluorescent substance according to Example 25. The results obtained in the above show that the fluorescent substances according to Examples 25 and 26 exhibited higher brightness compared to that of Comparative Example 1. The molar ratio was (group II element M+Eu):Al:Si:O:N=2:2.7 to 3.2:5.9 to 6.4:1.1 to 1.3:10.8 to 12.1.

EXAMPLES 27 to 34

The fluorescent substances according to Examples 27 to 34 were obtained in the same manner as in Example 1, except that the raw materials were weighed to satisfy the predetermined feed composition ratio. In Examples 27 to 34, in the feed composition ratio for $(Sr,Eu)_2Al_3Si_7O_1N_{13}$, the concentration of Eu is changed. In those fluorescent substances, $Sr_3N_3$ and $Eu_2O_3$ are used for the raw materials and a part of $Sr_3N_2$ is substituted with $Eu_2O_3$, so that the composition ratio of the final products are different than the respective feed composition ratio. Table 26 shows the measurement results of the feed composition ratio, chromaticity coordinates of emission color, brightness, and peak wavelength of emission spectrum of each fluorescent substance of Examples 27 to 34. Brightness shown in the table is a relative brightness with the brightness of the fluorescent substance of Comparative Example 1 as 100%.

TABLE 26

| | Feed Composition Ratio | Eu Concentration (%) | Chromaticity Coordinates x | Chromaticity Coordinates y | Brightness (%) | Peak Wavelength (nm) |
|---|---|---|---|---|---|---|
| Example 27 | $Sr_{1.99}Eu_{0.01}Al_3Si_7O_1N_{13}$ | 0.5 | 0.461 | 0.518 | 74.1 | 573 |
| Example 28 | $Sr_{1.97}Eu_{0.03}Al_3Si_7O_1N_{13}$ | 1.5 | 0.483 | 0.502 | 107.9 | 578 |
| Example 29 | $Sr_{1.95}Eu_{0.05}Al_3Si_7O_1N_{13}$ | 2.5 | 0.506 | 0.483 | 106.1 | 590 |
| Example 30 | $Sr_{1.90}Eu_{0.10}Al_3Si_7O_1N_{13}$ | 5 | 0.529 | 0.462 | 118.9 | 595 |
| Example 31 | $Sr_{1.85}Eu_{0.15}Al_3Si_7O_1N_{13}$ | 7.5 | 0.544 | 0.448 | 126.7 | 608 |
| Example 32 | $Sr_{1.75}Eu_{0.25}Al_3Si_7O_1N_{13}$ | 12.5 | 0.562 | 0.431 | 115.4 | 613 |
| Example 33 | $Sr_{1.70}Eu_{0.30}Al_3Si_7O_1N_{13}$ | 15 | 0.567 | 0.426 | 109.2 | 614 |
| Example 34 | $Sr_{1.50}Eu_{0.50}Al_3Si_7O_1N_{13}$ | 25 | 0.581 | 0.412 | 93.2 | 621 |
| Reference Example 1 | $Sr_{1.0}Eu_{1.0}Al_3Si_7O_1N_{13}$ | 50 | 0.594 | 0.398 | 61.2 | 626 |
| Reference Example 2 | $Sr_{0.5}Eu_{1.5}Al_3Si_7O_1N_{13}$ | 75 | 0.583 | 0.407 | 37.5 | 628 |
| Reference Example 3 | $Sr_{0.0}Eu_{2.0}Al_3Si_7O_1N_{13}$ | 100 | 0.491 | 0.486 | 15.6 | 610 |

Table 27 shows the values of intensity of the respective diffraction peaks corresponding to the Bragg angle ranges in the X-ray diffraction patterns respectively. The intensity of the diffraction peaks are shown as relative intensity with respect to the intensity of the diffraction peak in the Bragg angle range of 17.9° to 18.5° as 100%.

TABLE 27

| | XRD Peak Intensity 2θ/θ (°) | | | | | | | | | |
|---|---|---|---|---|---|---|---|---|---|---|
| | 17.9-18.5 | 24.5-25.1 | 29.0-29.6 | 29.6-30.2 | 30.6-31.2 | 31.4-32.0 | 34.8-35.4 | 35.7-36.3 | 47.9-48.5 | 68.7-69.3 |
| Example 27 | 100.0 | 269.6 | 168.1 | 92.8 | 284.8 | 412.9 | 481.4 | 395.4 | 212.5 | 244.1 |
| Example 28 | 100.0 | 275.2 | 177.1 | 97.3 | 262.0 | 441.9 | 488.0 | 396.9 | 209.7 | 232.9 |
| Example 29 | 100.0 | 288.1 | 188.9 | 96.7 | 279.0 | 414.0 | 522.2 | 407.8 | 223.5 | 245.7 |
| Example 30 | 100.0 | 284.0 | 186.1 | 96.6 | 272.6 | 431.2 | 534.2 | 424.1 | 225.7 | 261.2 |
| Example 31 | 100.0 | 217.4 | 146.7 | 79.1 | 217.1 | 329.6 | 394.1 | 337.3 | 180.1 | 197.6 |
| Example 32 | 100.0 | 235.9 | 161.7 | 100.8 | 228.2 | 369.4 | 417.7 | 323.0 | 186.7 | 219.0 |
| Example 33 | 100.0 | 245.2 | 182.2 | 119.2 | 247.5 | 411.0 | 450.7 | 371.2 | 211.9 | 223.7 |
| Example 34 | 100.0 | 212.5 | 162.9 | 135.8 | 192.2 | 359.9 | 364.2 | 312.1 | 190.1 | 224.6 |
| Reference Example 1 | 100.0 | 195.1 | 159.8 | 259.8 | 195.7 | 443.5 | 308.2 | 277.7 | 193.5 | 210.9 |
| Reference Example 2 | 100.0 | 135.4 | 143.9 | 345.7 | 173.8 | 437.2 | 218.9 | 234.1 | 182.9 | 232.9 |
| Reference Example 3 | 100.0 | 118.4 | 149.6 | 528.4 | 174.5 | 693.6 | 200.7 | 272.3 | 222.7 | 257.4 |

The results of elemental analysis of the fluorescent substances according to Examples 27 to 34 are shown in Table 28. The values obtained by the elemental analysis are shown in weight percent (wt %). Here, the measurement was carried out on each element separately so that small deviations may occur in the values obtained by the elemental analysis. Therefore, the sum of weight % values of all elements constituting each fluorescent substance of Examples 27 to 34 may not exactly be 100%.

TABLE 28

| | Elemental Analysis (wt %) | | | | | |
|---|---|---|---|---|---|---|
| | Sr | Eu | Al | Si | O | N |
| Example 27 | 26.8 | 0.2 | 12.7 | 29.7 | 3.0 | 26.8 |
| Example 28 | 26.2 | 0.6 | 12.7 | 29.3 | 2.9 | 26.3 |
| Example 29 | 26.1 | 1.1 | 12.7 | 29.6 | 2.9 | 26.4 |
| Example 30 | 22.0 | 2.1 | 13.6 | 27.1 | 3.0 | 26.6 |
| Example 31 | 24.1 | 4.5 | 12.4 | 27.4 | 4.9 | 24.3 |
| Example 32 | 23.0 | 5.5 | 12.2 | 28.5 | 3.5 | 25.5 |
| Example 33 | 22.5 | 6.5 | 12.3 | 29.1 | 3.7 | 25.4 |
| Example 34 | 19.5 | 10.6 | 12.1 | 27.6 | 3.9 | 24.2 |
| Reference Example 1 | 12.6 | 20.0 | 11.5 | 24.9 | 5.3 | 21.9 |
| Reference Example 2 | 6.1 | 28.6 | 10.9 | 24.3 | 6.6 | 19.9 |
| Reference Example 3 | 0.3 | 36.9 | 10.2 | 23.6 | 7.3 | 18.7 |

The calculated chemical formulas according to Examples 27 to 34 are shown in Table 29.

TABLE 29

| | Calculated Chemical Formula |
|---|---|
| Example 27 | $Sr_{1.99}Eu_{0.01}Al_{3.06}Si_{6.89}O_{1.22}N_{12.45}$ |
| Example 28 | $Sr_{1.97}Eu_{0.03}Al_{3.11}Si_{6.89}O_{1.19}N_{12.40}$ |
| Example 29 | $Sr_{1.95}Eu_{0.05}Al_{3.09}Si_{6.91}O_{1.17}N_{12.36}$ |
| Example 30 | $Sr_{1.90}Eu_{0.10}Al_{3.81}Si_{7.29}O_{1.40}N_{14.33}$ |
| Example 31 | $Sr_{1.81}Eu_{0.19}Al_{3.02}Si_{6.40}O_{2.00}N_{11.38}$ |
| Example 32 | $Sr_{1.76}Eu_{0.24}Al_{3.03}Si_{6.79}O_{1.48}N_{12.18}$ |
| Example 33 | $Sr_{1.71}Eu_{0.29}Al_{3.04}Si_{6.92}O_{1.54}N_{12.10}$ |
| Example 34 | $Sr_{1.52}Eu_{0.48}Al_{3.07}Si_{6.72}O_{1.67}N_{11.82}$ |

TABLE 29-continued

| | Calculated Chemical Formula |
|---|---|
| Reference Example 1 | $Sr_{1.04}Eu_{0.96}Al_{3.10}Si_{6.44}O_{2.39}N_{11.37}$ |
| Reference Example 2 | $Sr_{0.54}Eu_{1.46}Al_{3.13}Si_{6.71}O_{3.20}N_{11.05}$ |
| Reference Example 3 | $Sr_{0.03}Eu_{1.97}Al_{3.07}Si_{6.82}O_{3.70}N_{10.85}$ |

The results shows that the fluorescent substances of Examples 27 to 34 exhibit a high brightness with the concentration of Eu of 1.5% to 15%. A longer peak wavelength can be obtained with increasing Eu concentration. Here, in the case where the Eu concentration with respect to that of Sr is 75%, the brightness was 37.5%. At this time, the intensity of the X-ray diffraction peak in the Bragg angle range of 24.5° to 25.1° in the X-ray diffraction peak was 135.4 and the intensity of the X-ray diffraction peak in the Bragg angle range of 34.8° to 35.4° in the X-ray diffraction peak was 218.9. In the case where all of Sr was substituted with Eu, in other words, at the Eu concentration of 100%, the brightness was 15.6%. At this time, the intensity of the X-ray diffraction peak in the Bragg angle range of 24.5° to 25.1° in the X-ray diffraction peak was 118.4 and the intensity of the X-ray diffraction peak in the Bragg angle range of 34.8° to 35.4° in the X-ray diffraction peak was 200.7. A higher degree of substitution with Eu can be employed as compared to that in other fluorescent substances. Further, concentration quenching does not significantly occur. The concentration of Eu is preferably (group II element M+Eu)=2:0.03 to 0.29.

EXAMPLES 35 to 38

The fluorescent substances of Examples 35 to 38 were obtained in the same manner as in Example 1 except for use of $SrCO_3$, AlN, $Al_2O_3$, $Si_3N_4$, and $Eu_2O_3$ powders as raw materials and weighing the raw materials to satisfy the predetermined feed composition ratio. In Examples 35 to 38, the feed composition ratio for $Sr_aAl_bSi_cO_dN_e$:Eu is changed within a range of (Sr+Eu):(Al+Si)=2:9 to 13. However, the feed composition ratio of O and N is maintained at O:N=1:13. Table 30 shows the measurement results of the feed composition ratio, chromaticity coordinates of emission color, brightness, and peak wavelength of emission spectrum of each fluorescent substance of Examples 35 to 38. Brightness shown in the table is a relative brightness with the brightness of the fluorescent substance of Comparative Example 1 as 100%.

TABLE 30

| | Feed Composition Ratio | Sr + Eu/ Al + Si | Chromaticity Coordinates | | Brightness (%) | Peak Wavelength (nm) |
|---|---|---|---|---|---|---|
| | | | x | y | | |
| Reference Example 4 | $Sr_{1.8}Eu_{0.2}Al_{2.1}Si_{4.9}O_{0.73}N_{9.48}$ | 2/7 | 0.561 | 0.429 | 14.9 | 619 |
| Reference Example 5 | $Sr_{1.8}Eu_{0.2}Al_{2.4}Si_{5.6}O_{0.82}N_{10.65}$ | 2/8 | 0.557 | 0.434 | 38.4 | 611 |
| Example 35 | $Sr_{1.8}Eu_{0.2}Al_{2.7}Si_{6.3}O_{0.91}N_{11.83}$ | 2/9 | 0.554 | 0.438 | 86.9 | 610 |
| Example 36 | $Sr_{1.8}Eu_{0.2}Al_{3.3}Si_{7.7}O_{1.09}N_{14.17}$ | 2/11 | 0.547 | 0.445 | 121.5 | 607 |
| Example 37 | $Sr_{1.8}Eu_{0.2}Al_{3.6}Si_{8.4}O_{1.18}N_{15.35}$ | 2/12 | 0.544 | 0.448 | 110.5 | 602 |
| Example 38 | $Sr_{1.8}Eu_{0.2}Al_{3.9}Si_{9.1}O_{1.27}N_{16.52}$ | 2/13 | 0.541 | 0.451 | 95.2 | 601 |

Table 31 shows the values of intensity of the respective diffraction peaks corresponding to the Bragg angle ranges in the X-ray diffraction patterns respectively. The intensity of the diffraction peaks are shown as relative intensity with respect to the intensity of the diffraction peak in the Bragg angle range of 17.9° to 18.5° as 100%.

The results show that the fluorescent substances of Examples 35 to 38 are capable of providing a fluorescent substance exhibiting a high brightness at (Sr+Eu):(Al+Si)=2:11 to 12. Further, it is also possible for the peak wavelength to shift in a range of 610 nm to 601 nm. In the case where (Sr+Eu):(Al+Si)=2:7, the brightness was 14.9%. At this time, the intensity of the X-ray diffraction peak in the Bragg angle range of 34.8° to 35.4° in the intensity of the X-ray diffraction peak was 611.0. In the molar ratio, it is preferable for (group II element M+Eu):(Al+Si)=2:10.56 to 11.90.

TABLE 31

| | XRD Peak Intensity 2θ/θ (°) | | | | | | | | | |
|---|---|---|---|---|---|---|---|---|---|---|
| | 17.9-18.5 | 24.5-25.1 | 29.0-29.6 | 29.6-30.2 | 30.6-31.2 | 31.4-32.0 | 34.8-35.4 | 35.7-36.3 | 47.9-48.5 | 68.7-69.3 |
| Reference Example 4 | 100.0 | 178.7 | 154.8 | 131.6 | 503.2 | 309.7 | 611.0 | 627.1 | 178.7 | 288.4 |
| Reference Example 5 | 100.0 | 235.5 | 157.9 | 137.2 | 312.0 | 395.1 | 484.7 | 465.0 | 207.1 | 274.9 |
| Example 35 | 100.0 | 266.1 | 173.8 | 133.9 | 254.3 | 428.1 | 442.5 | 370.1 | 210.4 | 244.8 |
| Example 36 | 100.0 | 254.9 | 161.8 | 106.5 | 244.3 | 368.3 | 439.0 | 387.4 | 222.4 | 227.6 |
| Example 37 | 100.0 | 230.2 | 161.3 | 89.5 | 258.5 | 384.3 | 417.3 | 357.7 | 196.0 | 212.1 |
| Example 38 | 100.0 | 261.4 | 175.8 | 142.0 | 290.3 | 446.9 | 448.8 | 396.6 | 206.3 | 229.0 |

The results of elemental analysis of the fluorescent substances according to Examples 35 to 38 are shown in Table 32. The values obtained by the elemental analysis are shown in weight percent (wt %). The measurement was carried out on each element separately so that small deviations may occur in the values obtained by the elemental analysis. Therefore, the sum of wt % values of all elements constituting each fluorescent substance of Examples 35 to 38 may not exactly be 100%.

TABLE 32

| | Elemental Analysis (wt %) | | | | | |
|---|---|---|---|---|---|---|
| | Sr | Eu | Al | Si | O | N |
| Reference Example 4 | 28.8 | 5.5 | 10.6 | 25.5 | 4.0 | 23.0 |
| Reference Example 5 | 27.0 | 5.0 | 11.5 | 27.1 | 3.8 | 24.3 |
| Example 35 | 24.7 | 4.7 | 11.8 | 28.3 | 3.7 | 25.0 |
| Example 36 | 22.7 | 4.2 | 12.7 | 29.3 | 2.9 | 26.2 |
| Example 37 | 20.4 | 3.9 | 14.6 | 28.0 | 3.1 | 26.8 |
| Example 38 | 20.2 | 3.7 | 13.5 | 30.1 | 3.5 | 27.2 |

The calculated chemical formulas according to Examples 35 to 38 are shown in Table 33.

TABLE 33

| | Calculated Chemical Formula |
|---|---|
| Reference Example 4 | $Sr_{1.80}Eu_{0.20}Al_{2.15}Si_{4.98}O_{1.35}N_{9.00}$ |
| Reference Example 5 | $Sr_{1.81}Eu_{0.19}Al_{2.50}Si_{5.66}O_{1.38}N_{10.18}$ |
| Example 35 | $Sr_{1.80}Eu_{0.20}Al_{2.80}Si_{6.44}O_{1.48}N_{11.43}$ |
| Example 36 | $Sr_{1.81}Eu_{0.19}Al_{3.28}Si_{7.28}O_{1.26}N_{13.06}$ |
| Example 37 | $Sr_{1.80}Eu_{0.209}Al_{4.19}Si_{7.71}O_{1.51}N_{14.79}$ |
| Example 38 | $Sr_{1.81}Eu_{0.19}Al_{3.93}Si_{8.41}O_{1.70}N_{15.23}$ |

EXAMPLES 39 to 43

The fluorescent substances of Examples 39 to 43 were obtained in the same manner as in Example 1 except for use of $SrCO_3$, AlN, $Al_2O_3$, $Si_3N_4$, and $Eu_2O_3$ powders as raw materials and weighing the raw materials in order to satisfy the predetermined feed composition ratio. In Examples 39 to 43, the feed composition ratios for $Sr_aAl_bSi_cO_dN_e$:Eu are changed within the range of Al:Si=2.4:7.6 to 3.9:6.1. However, the feed composition ratio of O and N is maintained at O:N=1:13. In Table 34, the measurement results of the feed composition ratio, chromaticity coordinates of emission color, brightness, and peak wavelength of emission spectrum of each fluorescent substance of Examples 39 to 43 are shown. Brightness shown in the table is a relative brightness with the brightness of the fluorescent substance of Comparative Example 1 as 100%.

TABLE 34

| | Feed Composition Ratio | Al/Si | Chromaticity Coordinates | | Brightness (%) | Peak Wavelength (nm) |
|---|---|---|---|---|---|---|
| | | | x | y | | |
| Reference Example 6 | $Sr_{1.8}Eu_{0.2}Al_{2.1}Si_{7.9}O_{1.02}N_{13.29}$ | 2.1/7.9 | 0.583 | 0.409 | 55.5 | 630 |
| Example 39 | $Sr_{1.8}Eu_{0.2}Al_{2.4}Si_{7.6}O_{1.02}N_{13.19}$ | 2.4/7.6 | 0.568 | 0.424 | 75.2 | 621 |
| Example 40 | $Sr_{1.8}Eu_{0.2}Al_{2.7}Si_{7.3}O_{1.01}N_{13.10}$ | 2.7/7.3 | 0.559 | 0.434 | 106.6 | 610 |
| Example 41 | $Sr_{1.8}Eu_{0.2}Al_{3.3}Si_{6.7}O_{0.99}N_{12.91}$ | 3.3/6.7 | 0.552 | 0.441 | 123.7 | 608 |
| Example 42 | $Sr_{1.8}Eu_{0.2}Al_{3.6}Si_{6.4}O_{0.99}N_{12.81}$ | 3.6/6.4 | 0.552 | 0.441 | 111.2 | 609 |
| Example 43 | $Sr_{1.8}Eu_{0.2}Al_{3.9}Si_{6.1}O_{0.98}N_{12.72}$ | 3.9/6.1 | 0.556 | 0.437 | 92.6 | 609 |

Table 35 shows the values of intensity of the respective diffraction peaks corresponding to the Bragg angle ranges in the X-ray diffraction patterns respectively. The intensity of the diffraction peaks are shown as relative intensity with respect to the intensity of the diffraction peak in the Bragg angle range of 17.9° to 18.5° as 100%.

TABLE 35

| | XRD Peak Intensity 2θ/θ (°) | | | | | | | | |
|---|---|---|---|---|---|---|---|---|---|
| | 17.9-18.5 | 24.5-25.1 | 29.0-29.6 | 29.6-30.2 | 30.6-31.2 | 31.4-32.0 | 34.8-35.4 | 35.7-36.3 | 47.9-48.5 | 68.7-69.3 |
| Reference Example 6 | 100.0 | 246.0 | 159.2 | 86.7 | 283.9 | 342.7 | 461.1 | 360.2 | 190.5 | 213.3 |
| Example 39 | 100.0 | 247.8 | 174.6 | 87.5 | 267.0 | 346.9 | 433.9 | 357.6 | 196.0 | 233.0 |
| Example 40 | 100.0 | 271.2 | 186.3 | 88.6 | 282.2 | 412.3 | 459.8 | 370.3 | 221.9 | 233.8 |
| Example 41 | 100.0 | 238.8 | 153.9 | 111.0 | 231.8 | 382.0 | 438.8 | 371.0 | 205.3 | 217.6 |
| Example 42 | 100.0 | 231.0 | 156.3 | 125.0 | 224.6 | 387.7 | 392.1 | 332.1 | 184.1 | 202.8 |
| Example 43 | 100.0 | 217.2 | 143.6 | 131.7 | 209.9 | 401.6 | 390.5 | 363.8 | 181.5 | 200.0 |

The results of the elemental analysis of the fluorescent substances according to Examples 39 to 43 are shown in Table 36. The values obtained by the elemental analysis are shown in weight percent (wt %). Here, the measurement was carried out on each element separately so that small deviations may occur in the values obtained by the elemental analysis. Therefore, the sum of wt % values of all elements constituting each fluorescent substance of Examples 39 to 43 may not exactly be 100%.

TABLE 36

| | Elemental Analysis (wt %) | | | | | |
|---|---|---|---|---|---|---|
| | Sr | Eu | Al | Si | O | N |
| Reference Example 6 | 23.8 | 4.4 | 8.9 | 31.8 | 2.9 | 25.9 |
| Example 39 | 23.4 | 4.4 | 9.9 | 31.0 | 3.1 | 25.5 |
| Example 40 | 23.8 | 4.4 | 11.4 | 29.6 | 3.1 | 26.3 |
| Example 41 | 23.5 | 4.4 | 13.7 | 27.9 | 3.4 | 25.7 |
| Example 42 | 23.3 | 4.3 | 14.7 | 26.8 | 3.4 | 25.2 |
| Example 43 | 23.5 | 4.4 | 15.7 | 26.2 | 3.7 | 25.3 |

The calculated chemical formulas according to Examples 39 to 43 are shown in Table 37.

TABLE 37

| | Calculated Chemical Formula |
|---|---|
| Reference Example 6 | $Sr_{1.81}Eu_{0.19}Al_{2.19}Si_{7.53}O_{1.21}N_{12.32}$ |
| Example 39 | $Sr_{1.80}Eu_{0.20}Al_{2.48}Si_{7.46}O_{1.31}N_{12.30}$ |
| Example 40 | $Sr_{1.81}Eu_{0.19}Al_{2.81}Si_{7.01}O_{1.29}N_{12.49}$ |
| Example 41 | $Sr_{1.81}Eu_{0.19}Al_{3.42}Si_{6.69}O_{1.42}N_{12.33}$ |
| Example 42 | $Sr_{1.81}Eu_{0.19}Al_{3.70}Si_{6.49}O_{1.46}N_{12.22}$ |
| Example 43 | $Sr_{1.81}Eu_{0.19}Al_{3.92}Si_{6.28}O_{1.56}N_{12.15}$ |

The results show that upon excitation by a light emitting element which emits blue light with a peak wavelength at 460 nm, the fluorescent substances of Examples 39 to 43 emitted red light with a peak wavelength in a range of 608 nm to 621 nm. The fluorescent substances according to Examples 41 and 42 exhibited high brightness. In the molar ratio, it is preferable to be Al:Si=1:1.7 to 2.5.

EXAMPLES 44 to 48

The fluorescent substances of Examples 44 to 48 were obtained in the same manner as in Example 1 except for use of $SrCO_3$, AlN, $Al_2O_3$, $Si_3N_4$, and $Eu_2O_3$ powders as raw materials and weighing the raw materials in order to satisfy the predetermined feed composition ratio. In Examples 44 to 48, the feed composition ratios for $Sr_aAl_bSi_cO_dN_e$:Eu are changed within the range of (Sr+Eu):Al=2:2.4 to 3.9. However, the feed composition ratio of O and N is maintained at O:N=1:13. Table 38 shows the measurement results of the feed composition ratio, chromaticity coordinates of emission color, brightness, and peak wavelength of emission spectrum of each fluorescent substance of Examples 44 to 48. Brightness shown in the table is a relative brightness with the brightness of the fluorescent substance of Comparative Example 1 as 100%.

TABLE 38

| | Feed Composition Ratio | Al | Chromaticity Coordinates | | Brightness (%) | Peak Wavelength (nm) |
|---|---|---|---|---|---|---|
| | | | x | y | | |
| Reference Example 7 | $Sr_{1.8}Eu_{0.2}Al_{2.1}Si_7O_{0.93}N_{12.14}$ | 2.1 | 0.589 | 0.403 | 58.1 | 634 |
| Example 44 | $Sr_{1.8}Eu_{0.2}Al_{2.4}Si_7O_{0.96}N_{12.43}$ | 2.4 | 0.574 | 0.418 | 75.6 | 621 |
| Example 45 | $Sr_{1.8}Eu_{0.2}Al_{2.7}Si_7O_{0.98}N_{12.71}$ | 2.7 | 0.564 | 0.429 | 98.7 | 614 |
| Example 46 | $Sr_{1.8}Eu_{0.2}Al_{3.3}Si_7O_{1.02}N_{13.29}$ | 3.3 | 0.551 | 0.442 | 123.5 | 608 |
| Example 47 | $Sr_{1.8}Eu_{0.2}Al_{3.6}Si_7O_{1.04}N_{13.57}$ | 3.6 | 0.549 | 0.444 | 121.3 | 609 |
| Example 48 | $Sr_{1.8}Eu_{0.2}Al_{3.9}Si_7O_{1.07}N_{13.86}$ | 3.9 | 0.547 | 0.446 | 117.1 | 601 |

Table 39 shows the values of intensity of the respective diffraction peaks corresponding to the Bragg angle ranges in the X-ray diffraction patterns respectively. The intensity of the diffraction peaks are shown as relative intensity with respect to the intensity of the diffraction peak in the Bragg angle range of 17.9° to 18.5° as 100%.

TABLE 39

| | XRD Peak Intensity 2θ/θ (°) | | | | | | | | | |
|---|---|---|---|---|---|---|---|---|---|---|
| | 17.9-18.5 | 24.5-25.1 | 29.0-29.6 | 29.6-30.2 | 30.6-31.2 | 31.4-32.0 | 34.8-35.4 | 35.7-36.3 | 47.9-48.5 | 68.7-69.3 |
| Reference Example 7 | 100.0 | 228.9 | 161.8 | 84.6 | 266.7 | 307.5 | 451.8 | 361.4 | 179.8 | 225.0 |
| Example 44 | 100.0 | 272.3 | 186.4 | 86.8 | 259.5 | 355.9 | 452.3 | 362.7 | 202.7 | 238.6 |
| Example 45 | 100.0 | 245.8 | 171.1 | 96.4 | 267.6 | 388.4 | 471.6 | 370.7 | 216.0 | 247.6 |
| Example 46 | 100.0 | 224.5 | 160.5 | 88.1 | 227.7 | 337.9 | 412.3 | 364.8 | 192.5 | 217.0 |
| Example 47 | 100.0 | 235.5 | 156.2 | 91.2 | 234.7 | 369.3 | 404.4 | 358.6 | 193.2 | 218.7 |
| Example 48 | 100.0 | 246.2 | 170.1 | 119.9 | 248.4 | 422.2 | 454.3 | 398.2 | 222.2 | 233.0 |

The results of the elemental analysis of the fluorescent substances according to Examples 44 to 48 are shown in Table 40. The values obtained by the elemental analysis are shown in weight percent (wt %). The measurement was carried out on each element separately so that small deviations may occur in the values obtained by the elemental analysis. Therefore, the sum of wt % values of all elements constituting each fluorescent substance of Examples 44 to 48 may not exactly be 100%.

TABLE 40

| | Elemental Analysis (wt %) | | | | | |
|---|---|---|---|---|---|---|
| | Sr | Eu | Al | Si | O | N |
| Reference Example 7 | 24.9 | 4.7 | 9.4 | 30.9 | 2.9 | 25.5 |
| Example 44 | 24.7 | 4.6 | 10.4 | 29.7 | 2.9 | 25.3 |
| Example 45 | 24.4 | 4.5 | 11.6 | 29.0 | 3.0 | 26.1 |
| Example 46 | 23.3 | 4.3 | 13.6 | 27.8 | 3.1 | 25.9 |
| Example 47 | 22.7 | 4.2 | 14.0 | 28.6 | 3.2 | 25.6 |
| Example 48 | 22.3 | 4.2 | 14.9 | 27.0 | 3.2 | 25.8 |

The calculated chemical formulas according to Examples 44 to 48 are shown in Table 41.

TABLE 41

| | Calculated Chemical Formula |
|---|---|
| Reference Example 7 | $Sr_{1.80}Eu_{0.20}Al_{2.21}Si_{6.98}O_{1.15}N_{11.54}$ |
| Example 44 | $Sr_{1.81}Eu_{0.19}Al_{2.47}Si_{6.78}O_{1.16}N_{11.58}$ |
| Example 45 | $Sr_{1.81}Eu_{0.19}Al_{2.79}Si_{6.70}O_{1.23}N_{12.09}$ |
| Example 46 | $Sr_{1.81}Eu_{0.19}Al_{3.43}Si_{6.73}O_{1.32}N_{12.55}$ |

TABLE 41-continued

| | Calculated Chemical Formula |
|---|---|
| Example 47 | $Sr_{1.81}Eu_{0.19}Al_{3.62}Si_{7.10}O_{1.41}N_{12.73}$ |
| Example 48 | $Sr_{1.80}Eu_{0.20}Al_{3.91}Si_{6.81}O_{1.44}N_{13.08}$ |

The results show that upon excitation by a light emitting element which emits blue light with a peak wavelength at 460 nm, the fluorescent substances of Examples 44 to 48 emitted red light with a peak wavelength in a range of 601 nm to 621 nm. Increasing the amount of Al enables a shift of the peak wavelength toward shorter wavelength side. In the molar ratio, it is preferably (group II element M+Eu): Al=2:3.43 to 3.91.

EXAMPLES 49 to 54

The fluorescent substances of Examples 49 to 54 were obtained in the same manner as in Example 1 except for the use of $SrCO_3$, AlN, $Al_2O_3$, $Si_3N_4$, and $Eu_2O_3$ powders as raw materials and weighing the raw materials in order to satisfy the predetermined feed composition ratio. In Examples 49 to 54, the feed composition ratio for $Sr_aAl_bSi_cO_dN_e$:Eu are changed within a range of (Sr+Eu):Si=2:6.1 to 7.9. However, the feed composition ratio of O and N is maintained at O:N=1:13. Table 42 shows the measurement results of the feed composition ratio, chromaticity coordinates of emission color, brightness, and peak wavelength of emission spectrum for each fluorescent substance of Examples 49 to 54. The brightness shown in the table is a relative brightness with the brightness of the fluorescent substance of Comparative Example 1 as 100%.

TABLE 42

| | Feed Composition Ratio | Si | Chromaticity Coordinates | | Brightness (%) | Peak Wavelength (nm) |
|---|---|---|---|---|---|---|
| | | | x | y | | |
| Example 49 | $Sr_{1.8}Eu_{0.2}Al_3Si_{6.1}O_{0.91}N_{11.86}$ | 6.1 | 0.573 | 0.419 | 69.1 | 621 |
| Example 50 | $Sr_{1.8}Eu_{0.2}Al_3Si_{6.4}O_{0.94}N_{12.24}$ | 6.4 | 0.565 | 0.427 | 84.9 | 621 |
| Example 51 | $Sr_{1.8}Eu_{0.2}Al_3Si_{6.7}O_{0.97}N_{12.62}$ | 6.7 | 0.558 | 0.435 | 110.5 | 609 |
| Example 52 | $Sr_{1.8}Eu_{0.2}Al_3Si_{7.3}O_{1.03}N_{13.38}$ | 7.3 | 0.552 | 0.440 | 127.0 | 609 |
| Example 53 | $Sr_{1.8}Eu_{0.2}Al_3Si_{7.6}O_{1.06}N_{13.76}$ | 7.6 | 0.550 | 0.443 | 123.0 | 608 |
| Example 54 | $Sr_{1.8}Eu_{0.2}Al_3Si_{7.9}O_{1.09}N_{14.14}$ | 7.9 | 0.547 | 0.446 | 114.3 | 608 |

Table 43 shows the values of intensity of the respective diffraction peaks corresponding to the Bragg angle ranges in the X-ray diffraction patterns respectively. The intensity of the diffraction peaks are shown as relative intensity with respect to the intensity of the diffraction peak in the Bragg angle range of 17.9° to 18.5° as 100%.

TABLE 43

| | XRD Peak Intensity 2θ/θ (°) | | | | | | | | | |
|---|---|---|---|---|---|---|---|---|---|---|
| | 17.9-18.5 | 24.5-25.1 | 29.0-29.6 | 29.6-30.2 | 30.6-31.2 | 31.4-32.0 | 34.8-35.4 | 35.7-36.3 | 47.9-48.5 | 68.7-69.3 |
| Example 49 | 100.0 | 226.2 | 160.8 | 93.2 | 264.6 | 369.2 | 419.8 | 371.3 | 184.8 | 221.5 |
| Example 50 | 100.0 | 245.2 | 159.6 | 100.9 | 254.3 | 394.3 | 449.1 | 393.9 | 198.7 | 243.5 |
| Example 51 | 100.0 | 234.8 | 173.0 | 108.7 | 243.0 | 385.7 | 450.9 | 393.0 | 214.8 | 233.0 |
| Example 52 | 100.0 | 259.0 | 175.1 | 78.3 | 244.2 | 400.8 | 446.6 | 356.6 | 208.4 | 230.9 |
| Example 53 | 100.0 | 257.9 | 190.4 | 85.4 | 244.2 | 378.3 | 456.7 | 367.5 | 213.8 | 239.2 |
| Example 54 | 100.0 | 253.0 | 166.1 | 93.2 | 265.7 | 373.7 | 443.6 | 366.5 | 205.1 | 232.6 |

The results of the elemental analysis of the fluorescent substances according to Examples 49 to 54 are shown in Table 44. The values obtained by the elemental analysis are shown in weight %. Here, the measurement was carried out on each element separately so that small deviations may occur in the values obtained by the elemental analysis. Therefore, the sum of weight % values of all elements constituting each fluorescent substance of Examples 49 to 54 may not be exactly 100%.

TABLE 44

| | Elemental Analysis (wt %) | | | | | |
|---|---|---|---|---|---|---|
| | Sr | Eu | Al | Si | O | N |
| Example 49 | 24.6 | 4.6 | 12.8 | 27.6 | 3.2 | 25.7 |
| Example 50 | 24.1 | 4.5 | 12.8 | 27.7 | 3.2 | 25.4 |
| Example 51 | 23.9 | 4.5 | 12.6 | 28.3 | 3.1 | 25.6 |
| Example 52 | 23.2 | 4.3 | 12.0 | 29.5 | 3.0 | 26.3 |
| Example 53 | 23.1 | 4.3 | 11.8 | 29.7 | 2.9 | 26.1 |
| Example 54 | 22.4 | 4.1 | 11.5 | 31.6 | 3.2 | 26.2 |

The calculated chemical formulas according to Examples 49 to 54 are shown in Table 45.

TABLE 45

| | Calculated Chemical Formula (Sr + Eu = 2) |
|---|---|
| Example 49 | $Sr_{1.81}Eu_{0.19}Al_{3.05}Si_{6.32}O_{1.28}N_{11.80}$ |
| Example 50 | $Sr_{1.81}Eu_{0.19}Al_{3.11}Si_{6.47}O_{1.31}N_{11.88}$ |
| Example 51 | $Sr_{1.80}Eu_{0.20}Al_{3.09}Si_{6.66}O_{1.28}N_{12.09}$ |
| Example 52 | $Sr_{1.81}Eu_{0.19}Al_{3.04}Si_{7.17}O_{1.26}N_{12.84}$ |
| Example 53 | $Sr_{1.81}Eu_{0.19}Al_{3.00}Si_{7.24}O_{1.26}N_{12.76}$ |
| Example 54 | $Sr_{1.81}Eu_{0.19}Al_{3.02}Si_{7.96}O_{1.41}N_{13.24}$ |

As a result, upon excitation by a light emitting element which emits blue light with a peak wavelength at 460 nm, the fluorescent substances of Examples 49 to 54 emitted red light with a peak wavelength in a range of 608 nm to 621 nm. The fluorescent substances according to Examples 51 and 54 exhibited high brightness. The fluorescent substances according to Examples 51 to 54 can be made to have the peak wavelength of near 608 nm. In the molar ratio, it is preferably (group II element M+Eu):Si=2:6.66 to 7.96.

EXAMPLES 55 to 63

The fluorescent substances of Examples 55 to 63 were obtained in the same manner as in Example 1 except for the use of $SrCO_3$, AlN, $Al_2O_3$, $Si_3N_4$, and $Eu_2O_3$ powders as raw materials and weighing the raw materials in order to satisfy the predetermined feed composition ratio. In Examples 55 and 63, in $Sr_aAl_bSi_cO_dN_e$:Eu, the feed composition ratio of O and N is changed in a range of O:N=0.053 to 0.257:1. Table 46 shows the measurement results of the feed composition ratio, chromaticity coordinates of emission color, brightness, and peak wavelength of emission spectrum for each fluorescent substance of Examples 55 to 63. The brightness shown in the table is a relative brightness with the brightness of the fluorescent substance of Comparative Example 1 as 100%.

TABLE 46

| | Feed Composition Ratio | O/N | Chromaticity Coordinates | | Brightness (%) | Peak Wavelength (nm) |
|---|---|---|---|---|---|---|
| | | | x | y | | |
| Reference Example 8 | $Sr_{1.8}Eu_{0.2}Al_3Si_7N_{13.67}$ | — | 0.583 | 0.395 | 3.1 | 642 |
| Reference Example 9 | $Sr_{1.8}Eu_{0.2}Al_3Si_7O_{0.5}N_{13.33}$ | 0.038 | 0.574 | 0.419 | 64.2 | 620 |
| Example 55 | $Sr_{1.8}Eu_{0.2}Al_3Si_7O_{0.7}N_{13.21}$ | 0.053 | 0.560 | 0.433 | 114.0 | 609 |
| Example 56 | $Sr_{1.8}Eu_{0.2}Al_3Si_7O_{0.8}N_{13.14}$ | 0.061 | 0.557 | 0.436 | 120.4 | 609 |
| Example 57 | $Sr_{1.8}Eu_{0.2}Al_3Si_7O_{0.9}N_{13.07}$ | 0.069 | 0.555 | 0.438 | 123.3 | 608 |
| Example 58 | $Sr_{1.8}Eu_{0.2}Al_3Si_7O_{1.1}N_{12.94}$ | 0.085 | 0.551 | 0.441 | 123.5 | 609 |
| Example 59 | $Sr_{1.8}Eu_{0.2}Al_3Si_7O_{1.2}N_{12.87}$ | 0.093 | 0.549 | 0.443 | 122.6 | 609 |
| Example 60 | $Sr_{1.8}Eu_{0.2}Al_3Si_7O_{1.3}N_{12.81}$ | 0.101 | 0.548 | 0.445 | 120.6 | 609 |
| Example 61 | $Sr_{1.8}Eu_{0.2}Al_3Si_7O_{1.5}N_{12.67}$ | 0.118 | 0.552 | 0.440 | 113.4 | 609 |

TABLE 46-continued

| | Feed Composition Ratio | O/N | Chromaticity Coordinates x | Chromaticity Coordinates y | Brightness (%) | Peak Wavelength (nm) |
|---|---|---|---|---|---|---|
| Example 62 | $Sr_{1.8}Eu_{0.2}Al_3Si_7O_{2.0}N_{12.33}$ | 0.162 | 0.547 | 0.444 | 105.0 | 609 |
| Example 63 | $Sr_{1.8}Eu_{0.2}Al_3Si_7O_{3.0}N_{11.67}$ | 0.257 | 0.534 | 0.454 | 76.7 | 607 |
| Reference Example 10 | $Sr_{1.8}Eu_{0.2}Al_3Si_7O_{4.5}N_{10.67}$ | 0.422 | 0.389 | 0.554 | 25.9 | 547 |

Table 47 shows the values of intensity of the respective diffraction peaks corresponding to the Bragg angle ranges in the X-ray diffraction patterns respectively. The intensity of the diffraction peaks are shown as relative intensity with respect to the intensity of the diffraction peak in the Bragg angle range of 17.9° to 18.5° as 100%.

TABLE 47

| | XRD Peak Intensity 2θ/θ (°) | | | | | | | | | |
|---|---|---|---|---|---|---|---|---|---|---|
| | 17.9-18.5 | 24.5-25.1 | 29.0-29.6 | 29.6-30.2 | 30.6-31.2 | 31.4-32.0 | 34.8-35.4 | 35.7-36.3 | 47.9-48.5 | 68.7-69.3 |
| Reference Example 8 | 100.0 | 156.9 | 125.0 | 149.1 | 613.8 | 243.1 | 929.3 | 750.9 | 171.6 | 278.4 |
| Reference Example 9 | 100.0 | 244.3 | 180.9 | 102.2 | 319.6 | 444.8 | 512.2 | 354.8 | 187.0 | 235.7 |
| Example 55 | 100.0 | 234.7 | 165.7 | 92.8 | 222.7 | 351.8 | 432.7 | 359.8 | 200.8 | 219.1 |
| Example 56 | 100.0 | 272.4 | 191.9 | 107.7 | 268.8 | 386.0 | 470.1 | 390.5 | 223.5 | 240.3 |
| Example 57 | 100.0 | 272.3 | 184.8 | 100.9 | 231.6 | 379.2 | 454.1 | 403.9 | 228.1 | 242.9 |
| Example 58 | 100.0 | 264.2 | 181.4 | 114.2 | 260.2 | 424.8 | 465.9 | 389.4 | 228.8 | 249.1 |
| Example 59 | 100.0 | 263.5 | 174.0 | 133.8 | 258.4 | 423.7 | 472.6 | 420.1 | 219.6 | 227.4 |
| Example 60 | 100.0 | 267.5 | 185.0 | 158.3 | 270.4 | 489.8 | 473.8 | 412.1 | 240.3 | 248.1 |
| Example 61 | 100.0 | 268.3 | 175.8 | 146.7 | 241.9 | 473.1 | 450.7 | 352.9 | 196.0 | 218.9 |
| Example 62 | 100.0 | 238.2 | 167.6 | 243.0 | 253.1 | 542.5 | 430.9 | 360.4 | 200.0 | 226.6 |
| Example 63 | 100.0 | 188.8 | 173.7 | 502.6 | 269.7 | 821.1 | 350.0 | 329.6 | 211.2 | 222.4 |
| Reference Example 10 | 100.0 | 100.0 | 344.8 | 1229.3 | 264.7 | 1369.0 | 296.6 | 527.6 | 202.6 | 231.9 |

The results of the elemental analysis of the fluorescent substances according to Examples 55 to 63 are shown in Table 48. The values obtained by the elemental analysis are shown in weight percent (wt %). The measurement was carried out on each element separately so that small deviations may occur in the values obtained by the elemental analysis. Therefore, the sum of weight % values of all elements constituting each fluorescent substance of Examples 55 to 63 may not be exactly 100%.

TABLE 48

| | Elemental Analysis (wt %) | | | | | |
|---|---|---|---|---|---|---|
| | Sr | Eu | Al | Si | O | N |
| Reference Example 8 | 23.3 | 4.4 | 12.2 | 29.1 | 2.2 | 27.0 |
| Reference Example 9 | 23.6 | 4.4 | 12.5 | 29.5 | 2.2 | 26.5 |
| Example 55 | 22.8 | 4.3 | 13.1 | 29.0 | 2.5 | 26.5 |
| Example 56 | 23.5 | 4.4 | 12.6 | 29.1 | 2.7 | 26.3 |
| Example 57 | 23.5 | 4.4 | 12.5 | 28.6 | 3.0 | 26.2 |
| Example 58 | 23.9 | 4.4 | 12.4 | 28.5 | 3.2 | 25.5 |
| Example 59 | 24.1 | 4.4 | 12.5 | 28.1 | 3.6 | 25.6 |
| Example 60 | 23.8 | 4.4 | 12.1 | 28.5 | 3.8 | 24.7 |
| Example 61 | 23.3 | 4.3 | 14.7 | 26.8 | 3.4 | 25.2 |
| Example 62 | 24.1 | 4.5 | 12.4 | 27.4 | 4.9 | 24.3 |
| Example 63 | 23.3 | 4.4 | 12.2 | 28.2 | 7.3 | 22.8 |
| Reference Example 10 | 24.0 | 4.4 | 12.2 | 28.0 | 9.9 | 20.0 |

The calculated chemical formulas according to Examples 55 to 63 are shown in Table 49.

TABLE 49

| | Calculated Chemical Formula |
|---|---|
| Reference Example 8 | $Sr_{1.80}Eu_{0.20}Al_{3.07}Si_{7.03}O_{0.93}N_{13.10}$ |
| Reference Example 9 | $Sr_{1.81}Eu_{0.19}Al_{3.11}Si_{7.04}O_{0.94}N_{12.70}$ |
| Example 55 | $Sr_{1.80}Eu_{0.20}Al_{3.37}Si_{7.16}O_{1.10}N_{13.11}$ |

TABLE 49-continued

| | Calculated Chemical Formula |
|---|---|
| Example 56 | $Sr_{1.81}Eu_{0.19}Al_{3.14}Si_{6.97}O_{1.13}N_{12.64}$ |
| Example 57 | $Sr_{1.81}Eu_{0.19}Al_{3.12}Si_{6.85}O_{1.24}N_{12.59}$ |
| Example 58 | $Sr_{1.81}Eu_{0.19}Al_{3.05}Si_{6.73}O_{1.34}N_{12.05}$ |
| Example 59 | $Sr_{1.81}Eu_{0.19}Al_{3.05}Si_{6.58}O_{1.47}N_{12.01}$ |
| Example 60 | $Sr_{1.81}Eu_{0.19}Al_{2.98}Si_{6.75}O_{1.59}N_{11.74}$ |
| Example 61 | $Sr_{1.81}Eu_{0.19}Al_{3.70}Si_{6.49}O_{1.46}N_{12.22}$ |
| Example 62 | $Sr_{1.81}Eu_{0.19}Al_{3.02}Si_{6.40}O_{2.006}N_{11.38}$ |
| Example 63 | $Sr_{1.80}Eu_{0.20}Al_{3.07}Si_{6.81}O_{3.08}N_{11.02}$ |
| Reference Example 10 | $Sr_{1.81}Eu_{0.19}Al_{2.99}Si_{6.58}O_{4.07}N_{9.42}$ |

The results show that upon excitation by a light emitting element which emits blue light with a peak wavelength at 460 nm, the fluorescent substances of Examples 55 to 63 emitted red light with a peak wavelength near 609 nm. The fluorescent substances according to Examples 55 and 62 exhibited high brightness. Here, in the case where the fluorescent substance is made with a composition formula of $Sr_{1.81}Al_{3.11}Si_{7.04}O_{0.94}N_{12.70}:Eu_{0.19}$, the brightness was 3.1%, showing almost no emission. At this time, the intensity of the X-ray diffraction peak in the Bragg angle range of 34.8° to 35.4° was 929.3. Here, in the case where the fluorescent substance is made with a composition formula of $Sr_{1.81}Al_{3.11}Si_{7.04}O_{0.94}N_{12.70}:Eu_{0.19}$, the brightness was 25.9%, showing almost no emission. At this time, the intensity of the X-ray diffraction peak in the Bragg angle range of 34.8° to 35.4° was 296.6. According to Examples 55 to 63, it is preferably (group II element M+Eu):O:N=2:1.10 to 2.00:11.38 to 13.11.

COMPARATIVE EXAMPLE

Figure 19:
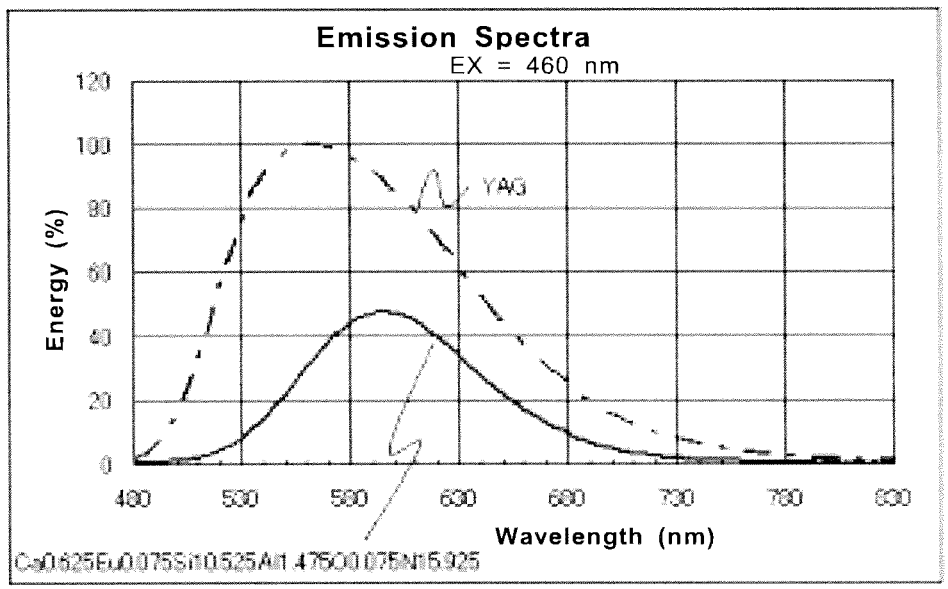
FIG. 19 shows an emission spectrum of the fluorescent substance of Comparative Example.

Based on the description in JP 2002-363554A (Patent Reference 1), $Ca_{0.625}Al_{1.475}Si_{10.525}O_{0.075}N_{15.925}:Eu_{0.075}$ was prepared. Table 50 shows the emission properties of $Ca_{0.625}Al_{1.475}Si_{10.525}O_{0.075}N_{15.925}:Eu_{0.075}$. FIG. 19 shows an emission spectrum for the fluorescent substance in the Comparative Example. The above-cited fluorescent substance is shown by comparison with a YAG fluorescent substance of $Y_{2.96}(Al_{0.8}, Ga_{0.2})_5O_{12}:Ce_{0.04}$. The result shows that the above-cited fluorescent substance exhibited a significantly lower brightness compared to that of the YAG fluorescent substance, indicating it is not suitable for practical use.

TABLE 50

| | Chromaticity Coordinates | | Brightness | Peak Wavelength |
|---|---|---|---|---|
| | x | y | (%) | (nm) |
| $Ca_{0.625}Al_{1.475}Si_{10.525}O_{0.075}N_{15.925}:Eu_{0.075}$ | 0.532 | 0.459 | 35.0 | 595 |
| $Y_{2.96}(Al_{0.8},Ga_{0.2})_5O_{12}:Ce_{0.04}$ | 0.457 | 0.527 | 103.3 | 566 |

Figure 20:
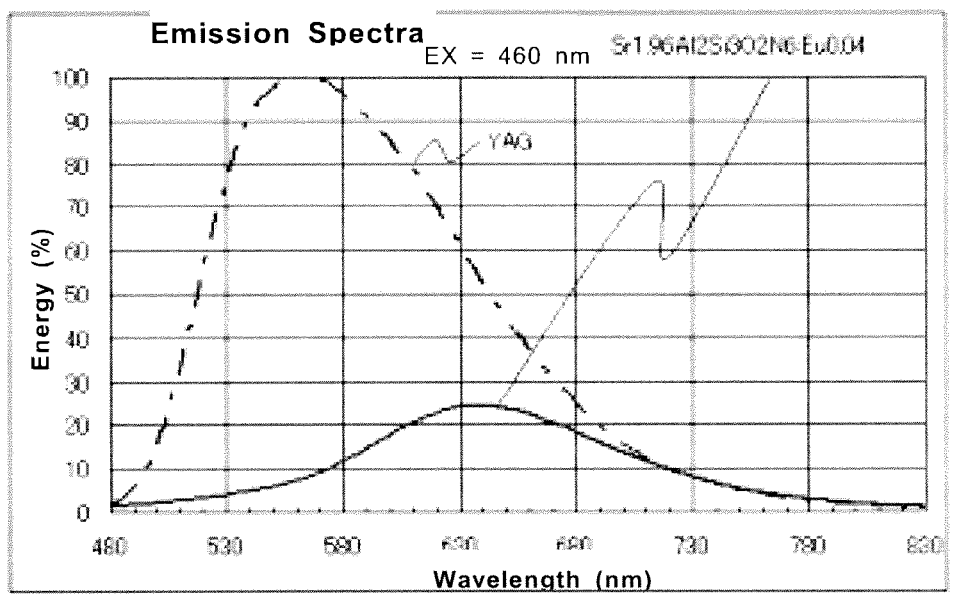
FIG. 20 shows an emission spectrum of the fluorescent substance of Comparative Example.

Based on the description in JP 2005-48105A (Patent Reference 2), $Sr_{1.96}Al_2Si_3O_2N_6:Eu_{0.04}$ was prepared. Table 51 shows the emission properties of $Sr_{1.96}Al_2Si_3O_2N_6:Eu_{0.04}$. FIG. 20 shows an emission spectrum for the fluorescent substance in the Comparative Example. The above-cited fluorescent substance is shown by comparison with a YAG fluorescent substance of $Y_{2.96}(Al_{0.8}, Ga_{0.2})_5O_{12}:Ce_{0.04}$. The results show that the above-cited fluorescent substance exhibited a significantly lower brightness compared to that of the YAG fluorescent substance, indicating it is not suitable for practical use.

TABLE 51

| | Chromaticity Coordinates | | Brightness | Peak Wavelength |
|---|---|---|---|---|
| | x | y | (%) | (nm) |
| $Sr_{1.96}Al_2Si_3O_2N_6:Eu_{0.04}$ | 0.564 | 0.419 | 13.2 | 636 |
| $Y_{2.96}(Al_{0.8},Ga_{0.2})_5O_{12}:Ce_{0.04}$ | 0.457 | 0.527 | 103.3 | 566 |

Figure 21:
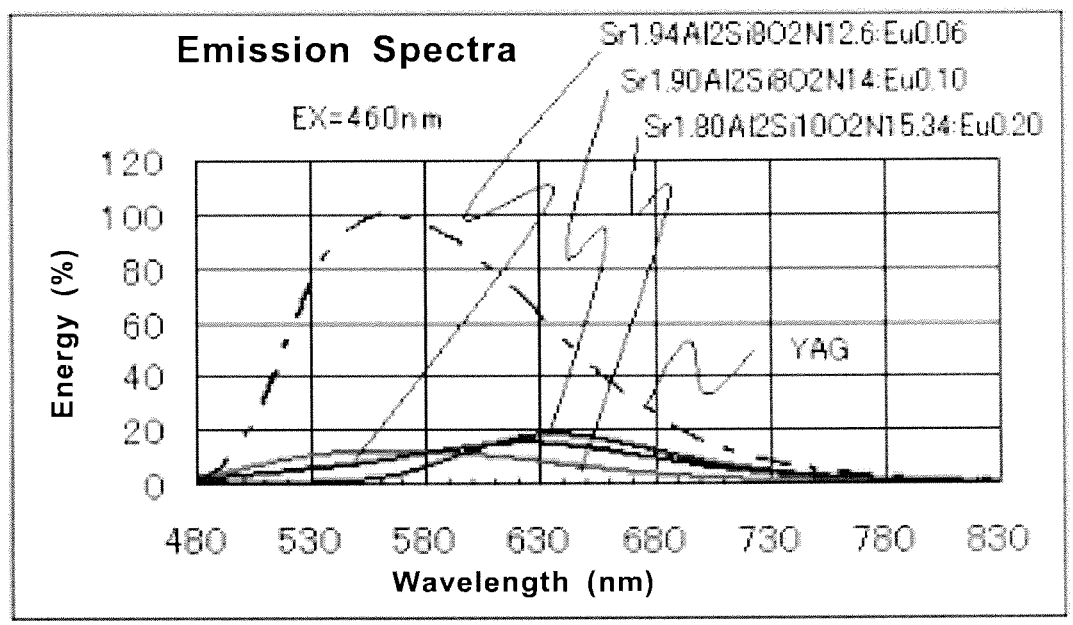
FIG. 21 shows an emission spectrum of the fluorescent substance of Comparative Example.

Based on the description in WO 2006/093298 A (Patent Reference 4), $Sr_{1.94}Al_2Si_8O_2N_{12.6}:Eu_{0.06}$, $Sr_{1.90}Al_2Si_8O_2N_{14}:Eu_{0.10}$, and $Sr_{1.80}Al_2Si_{10}O_2N_{15.34}:Eu_{0.20}$ were prepared. Table 52 shows the emission properties of the above-cited fluorescent substances. FIG. 21 shows emission spectra for fluorescent substances in the Comparative Example. The above-cited fluorescent substances are compared with a YAG fluorescent substance. The results show that the above-cited fluorescent substances exhibited significantly lower brightness compared to that of the YAG fluorescent substance, indicating it is not suitable for practical use.

TABLE 52

| | Chromaticity Coordinates | | Brightness | Peak Wavelength |
|---|---|---|---|---|
| | x | y | (%) | (nm) |
| $Sr_{1.94}Al_2Si_8O_2N_{12.6}:Eu_{0.06}$ | 0.516 | 0.459 | 11.9 | 621 |
| $Sr_{1.90}Al_2Si_8O_2N_{14}:Eu_{0.10}$ | 0.613 | 0.375 | 7.1 | 636 |
| $Sr_{1.80}Al_2Si_{10}O_2N_{15.34}:Eu_{0.20}$ | 0.432 | 0.527 | 13.6 | 570 |
| $Y_{2.96}(Al_{0.8},Ga_{0.2})_5O_{12}:Ce_{0.04}$ | 0.457 | 0.527 | 103.3 | 566 |

INDUSTRIAL APPLICABILITY

The fluorescent substance and the light emitting device using the fluorescent substance according to the present invention can be suitably applicable to vacuum fluorescent display tubes, displays, PDPs, CRTs, FLs, FEDs and projectors, particularly to lighting applications emitting white light of a warmer tone which use blue light emitting diodes or ultraviolet emitting diodes as a light source and have excellent light emitting properties.

DENOTATION OF REFERENCE NUMERALS

2 . . . light emitting element
3 . . . fluorescent substance
14 . . . recess
15 . . . lead electrode
16 . . . supporting member
17 . . . package
18 . . . sealing member
60 . . . light emitting device

What is claimed is:

1. A fluorescent substance that has an emission peak wavelength at 584 nm to 630 nm upon being excited by a light source of 460 nm, wherein:
  the fluorescent substance is $Sr_{1.78}Eu_{0.22}Al_{5.73}Si_{7.39}O_{1.35}N_{15.62}$, and
  the fluorescent substance has a formation phase whose main phase shows, in an X-ray diffraction pattern using CuKα radiation with an intensity of a diffraction peak in a Bragg angle range of 17.9° to 18.5° taken as 100%, a relative intensity of the diffraction peak in a range of 150% to 310% in a Bragg angle range of 24.5° to 25.1° and a relative intensity of the diffraction peak in a range of 320% to 550% in a Bragg angle range of 34.8° to 35.4°.

2. The fluorescent substance according to claim 1, wherein a relative intensity of the diffraction peak is in a range of 190% to 460% in a Bragg angle range of 30.6° to 31.2°.

3. The fluorescent substance according to claim 1, wherein a relative intensity of the diffraction peak is in a range of 270% to 570% in a Bragg angle range of 35.7° to 36.3°.

4. The fluorescent substance according to claim 1, wherein a relative intensity of the diffraction peak is in a range of 160% to 320% in a Bragg angle range of 68.7° to 69.3°.

5. The fluorescent substance according to claim 1, wherein the formation phase belongs to orthorhombic system with lattice constant in a range of 4.4 Å≤a ≤5.4 Å, 7.0 Å≤b≤8.0 Å, and 11.1 Å≤c≤12.1 Å.

6. The fluorescent substance according to claim 1, wherein half bandwidth of emission spectra of the fluorescent substance is in a range of 100 nm to 125 nm.

7. A light emitting device comprising:
an excitation light source configured to emit light having a peak wavelength in a range from near-ultraviolet to short wavelength range of visible light, and
a fluorescent substance capable of absorbing a part of light from the excitation light source and emitting fluorescent light;
wherein the fluorescent substance comprises the fluorescent substance according to claim 1.

8. A fluorescent substance that has an emission peak wavelength at 584 nm to 630 nm upon being excited by a light source of 460 nm, wherein :
the fluorescent substance is $Sr_{1.78}Eu_{0.22}Al_{4.09}Si_{7.76}O_{1.30}N_{14.23}$, and
the fluorescent substance has a formation phase whose main phase shows, in an X-ray diffraction pattern using CuKα radiation with an intensity of a diffraction peak in a Bragg angle range of 17.9° to 18.5° taken as 100%, a relative intensity of the diffraction peak in a range of 150% to 310% in a Bragg angle range of 24.5° to 25.1° and a relative intensity of the diffraction peak in a range of 320% to 550% in a Bragg angle range of 34.8° to 35.4°.

9. The fluorescent substance according to claim 8, wherein a relative intensity of the diffraction peak is in a range of 190% to 460% in a Bragg angle range of 30.6° to 31.2°.

10. The fluorescent substance according to claim 8, wherein a relative intensity of the diffraction peak is in a range of 270% to 570% in a Bragg angle range of 35.7° to 36.3°.

11. The fluorescent substance according to claim 8, wherein a relative intensity of the diffraction peak is in a range of 160% to 320% in a Bragg angle range of 68.7° to 69.3°.

12. The fluorescent substance according to claim 8, wherein the formation phase belongs to orthorhombic system with lattice constant in a range of 4.4 Å≤a ≤5.4 Å, 7.0 Å≤b≤8.0 Å, and 11.1 Å≤c≤12.1 Å.

13. The fluorescent substance according to claim 8, wherein half bandwidth of emission spectra of the fluorescent substance is in a range of 100 nm to 125 nm.

14. A light emitting device comprising:
an excitation light source configured to emit light having a peak wavelength in a range from near-ultraviolet to short wavelength range of visible light, and
a fluorescent substance capable of absorbing a part of light from the excitation light source and emitting fluorescent light;
wherein the fluorescent substance comprises the fluorescent substance according to claim 8.

15. A fluorescent substance that has an emission peak wavelength at 584 nm to 630 nm upon being excited by a light source of 460 nm, wherein :
the fluorescent substance is $Sr_{1.80}Eu_{0.209}Al_{4.19}Si_{7.71}O_{1.51}N_{14.79}$, and
the fluorescent substance has a formation phase whose main phase shows, in an X-ray diffraction pattern using CuKα radiation with an intensity of a diffraction peak in a Bragg angle range of 17.9° to 18.5° taken as 100%, a relative intensity of the diffraction peak in a range of 150% to 310% in a Bragg angle range of 24.5° to 25.1° and a relative intensity of the diffraction peak in a range of 320% to 550% in a Bragg angle range of 34.8° to 35.4°.

16. The fluorescent substance according to claim 15, wherein a relative intensity of the diffraction peak is in a range of 190% to 460% in a Bragg angle range of 30.6° to 31.2°.

17. The fluorescent substance according to claim 15, wherein a relative intensity of the diffraction peak is in a range of 270% to 570% in a Bragg angle range of 35.7° to 36.3°.

18. The fluorescent substance according to claim 15, wherein a relative intensity of the diffraction peak is in a range of 160% to 320% in a Bragg angle range of 68.7° to 69.3°.

19. The fluorescent substance according to claim 15, wherein the formation phase belongs to orthorhombic system with lattice constant in a range of 4.4 Å≤a≤5.4 Å, 7.0 Å≤b≤8.0 Å, and 11.1 Å≤c≤12.1 Å.

20. The fluorescent substance according to claim 15, wherein half bandwidth of emission spectra of the fluorescent substance is in a range of 100 nm to 125 nm.

21. A light emitting device comprising:
an excitation light source configured to emit light having a peak wavelength in a range from near-ultraviolet to short wavelength range of visible light, and
a fluorescent substance capable of absorbing a part of light from the excitation light source and emitting fluorescent light;
wherein the fluorescent substance comprises the fluorescent substance according to claim 15.

* * * * *